(12) United States Patent
Kuksenkov et al.

(10) Patent No.: US 8,320,418 B2
(45) Date of Patent: Nov. 27, 2012

(54) MULTIPLE WAVELENGTH OPTICAL SYSTEMS

(75) Inventors: Dmitri Vladislavovich Kuksenkov, Big Flats, NY (US); Shenping Li, Painted Post, NY (US); Rostislav Vatchev Roussev, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 188 days.

(21) Appl. No.: 12/782,205

(22) Filed: May 18, 2010

(65) Prior Publication Data
US 2011/0286477 A1 Nov. 24, 2011

(51) Int. Cl.
*H01S 3/10* (2006.01)

(52) U.S. Cl. .............................. 372/22; 372/21; 372/23

(58) Field of Classification Search .................. None
See application file for complete search history.

(56) References Cited

U.S. PATENT DOCUMENTS

| | | | |
|---|---|---|---|
| 6,714,569 B2 * | 3/2004 | Zhu et al. ........................ | 372/22 |
| 6,806,986 B2 * | 10/2004 | Asobe et al. .................... | 359/238 |
| 7,116,468 B2 | 10/2006 | Miller ........................... | 359/326 |
| 7,265,897 B2 | 9/2007 | Miller et al. .................... | 359/326 |
| 7,289,261 B2 | 10/2007 | Miller ........................... | 359/326 |
| 7,551,653 B2 * | 6/2009 | Spiekermann et al. ......... | 372/21 |
| 2009/0067459 A1 | 3/2009 | Mizuuchi et al. | |
| 2009/0154508 A1 * | 6/2009 | Chou et al. ...................... | 372/22 |

OTHER PUBLICATIONS

"Dual Wavelength Asymmetric Cladding InGaAs-GaAs Ridge Waveguide Distributed Bragg Reflector Lasers"; Roh et al; IEEE Photonics Technology Letters; vol. 11; No. 1, Jan. 1999; p. 15-17.

"Two Longitudinal Mode Laser Diodes"; Iio et al; IEEE Photonics Technology Letters; vol. 7; No. 9, Sep. 1995; p. 959-961.

"Multiple channel wavelength conversion by use of engineered quasi-phase-matching structures in $LiNbO_3$ waveguides"; Chou et al; Optics Letters; Aug. 15, 1999; vol. 24, No. 16; p. 1157-1159.

"Engineering competing nonlinearities"; Bang et al; Optics Letters; Oct. 15, 1999; vol. 24; No. 20; p. 1413-1415.

"Multiple quasi-phase-matched $LiNbO_3$ wavelength converter with a continuously phase-modulated domain structure"; Asobe et al; Optics Letters; vol. 28, No. 7, Apr. 1, 2003; p. 558-560.

"Nonlinear multiwavelength conversion based on an aperiodic optical superlattice in lithium niobate"; Lee et al; Optics Letters; Dec. 15, 2002; vol. 27; No. 24; p. 2191-2193.

"Broad-Band Second-Harmonic Generation in $LiNbO_3$ Waveguide Using Optimized Domain Inverted Grating"; Wu et al; Journal of Applied Physics; Vo. 33(1994), p. 1163-1166.

(Continued)

*Primary Examiner* — Armando Rodriguez
*Assistant Examiner* — Sean Hagan
(74) *Attorney, Agent, or Firm* — Svetlana Z. Short

(57) ABSTRACT

Optical systems operable to emit multiple frequency-converted spectral peaks are provided. In one embodiment, an optical system includes an optical source and a wavelength conversion device. The optical source may include a laser configured to emit a pump beam having at least two fundamental spectral peaks. The wavelength conversion device may include a non-linear optical medium configured to phase match the second harmonic generation of each of the at least two fundamental spectral peaks and sum-frequency generation of the at least two fundamental spectral peaks such that an output beam comprising at least three frequency-converted spectral peaks having approximately equal power is emitted from an output facet of the wavelength conversion device when the pump beam of the optical source is incident on an input facet of the wavelength conversion device.

21 Claims, 8 Drawing Sheets

OTHER PUBLICATIONS

"Multiple quasi phase matching in a nonperiodic domain inverted optical superlattice"; Chen et al; Physical Review; A69; 013818 (2004); p. 013818-1 to 013818-4.

"Experimental realization of second harmonic generation in a fibonaci optical superlattice of $LiTaO_3$"; Zhu et al; Physical Review Letters; Apr. 7, 1997; vol. 78; No. 14; p. 2752-2755.

"Quasi phase matched third harmonic generation in a quasi periodic optical superlattice"; Zhu et al; Science Magazine; Oct. 31, 1997; p. 843-846.

"Quasi phase matched second harmonic generation: tuning and tolerances"; Fejer et al; IEEE Journal of Quantum Electronics; vol. 28; No. 11; Nov. 1992; p. 2631-2654.

Kashi et al, "Multiple-Wavelength Quasi-Phase-Matched Nonlinear Interactions", J. of Quantum Electronics, vol. 35, No. 11, pp. 1649-1656, Nov. 1, 1999.

Karaloglu et al, "Simultaneous phase matching of optical parametric oscillation and second-harmonic generation in a periodically poled lithium niobate" J. of the Optical Society of America, vol. 20, No. 2, pp. 343-350, Feb. 1, 2003.

\* cited by examiner

MULTIPLE WAVELENGTH OPTICAL SYSTEMS

BACKGROUND

1. Field

Embodiments of the present disclosure generally relate to optical systems such as laser systems. More specifically, the embodiments relate to optical systems capable of producing one or more output beams having multiple frequency-converted spectral peaks for reducing the appearance of speckle in a laser-projected image.

2. Technical Background

While blue and red semiconductor lasers are currently readily available, the progress in nitride semiconductor technology has not yet resulted in a creation of native green lasers with sufficient output power, efficiency and cost effectiveness. An attractive alternative is to use a near-infrared (1060 nm) laser diode and generate green light by frequency doubling in a nonlinear optical medium, such as periodically poled lithium niobate (PPLN) crystal. This allows for a small package size and reasonable efficiency, but results in a high level of speckle in projected images due to the high spectral and spatial coherence of the laser source.

Speckle is observed whenever a coherent light source is used to illuminate a rough surface, for example, a screen, wall, or any other object that produces a diffused reflection or transmission. Particularly, a multitude of small areas of the screen or other reflecting objects scatter light into a multitude of reflected beams with different points of origination and different propagation directions. At an observation point, for example in the eyes of an observer or at the sensor of a camera, these beams interfere constructively to form a bright spot, or destructively to form a dark spot, producing a random granular intensity pattern known as speckle. Speckle causes high spatial frequency noise in the projected image. Speckle may be characterized by grain size and contrast, the latter usually defined as a ratio of standard deviation to mean light intensity in the observation plane. For a large enough illuminated area and a small enough surface roughness, the speckle will be "fully developed," with a brightness standard deviation of 100%. If an image is formed on the screen using a coherent light source such as a laser beam, such granular structure will represent noise resulting in serious degradation of the image quality. This noise presents a significant problem, particularly when the projector is used to display high spatial-frequency image content, such as text.

Accordingly, a need exists for optical systems that reduce the appearance of speckle to improve the image quality of laser projected images.

SUMMARY

In one embodiment, an optical system includes an optical source and a wavelength conversion device. The optical source may include a laser configured to emit a pump beam having at least two fundamental spectral peaks. The wavelength conversion device may include a non-linear optical medium configured to phase match the second harmonic generation of each of the at least two fundamental spectral peaks and sum-frequency generation of the at least two fundamental spectral peaks such that an output beam comprising at least three frequency-converted spectral peaks having approximately equal power is emitted from an output facet of the wavelength conversion device when the pump beam of the optical source is incident on an input facet of the wavelength conversion device.

In another embodiment, an optical system includes an optical source and a wavelength conversion device. The optical source may include at least one laser configured to emit a pump beam having at least two fundamental spectral peaks separated by at least 0.5 nanometers in wavelength. The wavelength conversion device comprises a non-linear optical medium characterized by a phase modulation function that provides at least three phase matching peaks having a response ratio that produces the three frequency-converted spectral peaks having approximately equal power and separated by more than 0.25 nanometers in wavelength when the pump beam is incident on the input facet of the wavelength conversion device. The number of frequency-converted spectral peaks of the output beam is greater than the number of fundamental spectral peaks of the pump beam.

DETAILED DESCRIPTION

Embodiments described herein generally relate to optical systems that may reduce the appearance of speckle in images when incorporated into a laser projector system. Although embodiments described herein may be described in the context of laser projection systems, embodiments are not limited thereto. Embodiments described herein may be incorporated into systems other then laser projector systems.

Figure 1:
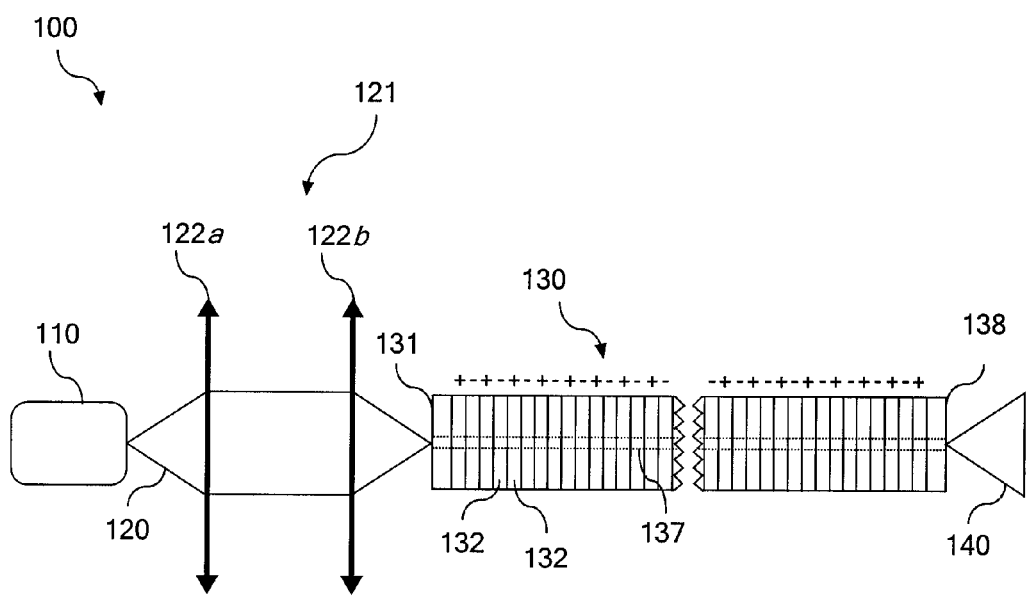
FIG. 1 is a schematic diagram of an optical system according to one or more embodiments shown and described herein.

Reference will now be made in detail to embodiments of the present disclosure, examples of which are illustrated in the accompanying drawings. Whenever possible, the same reference numerals will be used throughout the drawings to refer to the same or like parts. One embodiment of an optical system is shown in FIG. 1. The optical system generally comprises at least one semiconductor laser, optional coupling optics, and a wavelength conversion device. A package controller may be included to operate the semiconductor laser and/or coupling optics. The output of the semiconductor laser is optically coupled into the input of the wavelength conversion device either directly or by the use of the coupling optics. The semiconductor laser produces a pump beam having at least two fundamental spectral peaks separated by $\Delta\lambda_{IR}$. The wavelength conversion device converts the energy of the pump beam emitted by the semiconductor laser into an output beam having at least three frequency-converted spectral peaks. Various components and configurations of the optical system will be further described herein.

Figure 2:
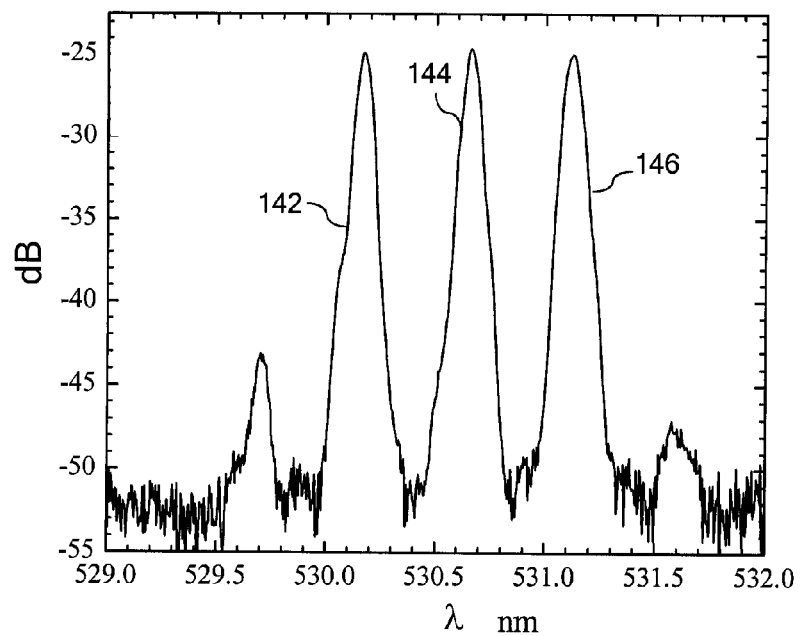
FIG. 2 is a graph depicting an optical spectrum of the frequency converted output beam produced by one or more embodiments as shown and described herein.

FIG. 1 generally depicts an optical system 100 described herein. A pump beam 120 emitted by the semiconductor laser 110 may have two simultaneously emitted fundamental spectral peaks in the infrared wavelength band. The pump beam 120 may be either directly coupled into a waveguide portion 137 of the wavelength conversion device 130 or can be coupled into the waveguide portion of wavelength conversion device 130 using adaptive optics, illustrated as first and second coupling optics 121 (e.g., lenses 122a and 122b). The wavelength conversion device 130 converts the output wavelengths of the pump beam 120 into higher harmonic waves and produces a visible output beam 140 having three frequency-converted spectral peaks 142, 144, and 146 (FIG. 2). This type of optical package is particularly useful in generating shorter wavelength laser beams from longer wavelength semiconductor lasers and can be used, for example, as a visible light source for laser projection systems.

The optical source 110 may comprise one or more lasers, such as distributed feedback (DFB) lasers, distributed Bragg reflector (DBR) lasers, vertical cavity surface-emitting lasers (VCSEL), vertical external cavity surface-emitting lasers (VECSEL) or Fabry-Perot lasers, for example. In addition, if the laser gain medium is a semiconductor medium, it may involve the use of carrier confinement in quantum wells, quantum wires, or quantum dots. In laser projection system applications, the optical source may comprise three semiconductor lasers: a first semiconductor laser to emit a beam in the red spectral range, a second semiconductor laser to emit a beam in the blue spectral range, and a third semiconductor laser to emit a beam in the infrared spectral range, which is then frequency up-converted into one or more frequency-converted spectral peaks in a frequency up-converted range (e.g., the green or yellow spectral range). The optical source 110 and optical system 100 may be programmed and operated together with scanning or image forming optics (not shown in figures) to generate a laser projected image comprising a plurality of pixels across a projection surface.

Embodiments described herein utilize spectral broadening of the green or yellow frequency-converted output beam leading to a reduction of speckle contrast. Speckle results from random interference of light reflected by random roughness features on the projection surface. The interference may be constructive or destructive, causing respective bright and dark sports to appear in the image. The optical sources of the embodiments described herein emit an output beam having multiple frequency-converted spectral peaks to broaden the spectrum of the frequency-converted light that is incident on the projection surface. If light of different wavelengths is present in an output beam illuminating the screen, the interference can be constructive for one wavelength and destructive for another one, canceling the net effect. The two speckle patterns produced by two wavelengths separated by $\Delta\lambda$ are correlated by less than $1/e^2$ if:

$$|\Delta\lambda| \geq \frac{1}{2\sqrt{2\pi}} \frac{\bar{\lambda}^2}{\sigma_h}, \qquad \text{Eq. (1)}$$

where $\sigma_h$ is the standard deviation of the screen surface local height (measure of roughness). If the optical intensity is equally distributed between the two different wavelengths producing the two uncorrelated speckle patterns, then the speckle contrast may be reduced by approximately $\sqrt{2}$. Assuming mean wavelength of about 530 nm and roughness at the projection surface of about 100 μm, the wavelength separation of the frequency-converted spectral peaks should be greater than or equal to about 0.5 nm However, smaller wavelength separation may still produce some speckle reduction, generally smaller than the factor of $\sqrt{2}$ achievable by two uncorrelated speckle patterns. If three wavelengths are present in the laser beam, and separation between them satisfies Eq. (1), then the expected speckle contrast may be reduced approximately by a factor of $\sqrt{3}$. Therefore, the wavelength separation should be large enough to achieve the desired speckle contrast reduction.

To achieve a visible light beam 140 having three frequency-converted spectral peaks 142, 144, 146 in the green spectral range that are separated by $\Delta\lambda$, the optical source 110 produces a pump beam 120 having two fundamental spectral peaks separated by $\Delta\lambda_{IR}$. As described in more detail below, the wavelength conversion device 130 frequency-converts the fundamental spectral peaks of the pump beam to generate three frequency-converted spectral peaks in a visible output light beam. Although embodiments are described herein in the context of DBR semiconductor lasers, it will be understood that other semiconductor laser configurations may also be utilized. Further, although embodiments are described herein in the context of a pump beam having two fundamental spectral peaks and a wavelength conversion device having at least three phase-matching peaks that produce an output beam having three frequency-converted spectral peaks, embodiments may utilize a semiconductor laser that produces a pump beam having N fundamental spectral peaks and a wavelength conversion device that produces between 2N−1 and (N+1)N/2 frequency-converted spectral peaks, as described in more detail below.

It is normally difficult to force a semiconductor laser to simultaneously output two wavelengths because they compete for gain, and even a slight difference in threshold causes the laser to prefer one of the fundamental spectral peaks. The present inventors have recognized that with laser diodes containing integrated frequency selective elements (DFB and DBR) or Fabry-Perot lasers supplied with external frequency selective reflectors, it may be easier to achieve a multi-spectral peak output if a laser diode is operated in a pulsed mode, such as either Q-switching or gain-switching, for example. Lasers designed for Q-switching usually incorporate a saturable absorber (SA) section within the cavity. The loss of that section is modulated either actively (by applying a periodically modulated bias), or passively (by allowing the amplified spontaneous emission inside the laser cavity to build up to the point when loss in the SA section is saturated), and the laser emits a short intense pulse of light each time the loss of the SA section becomes low. In gain switching, the main amplifying (gain) section is driven by a periodic (e.g., sinusoidal) signal, and the short pulse (essentially the first relaxation oscillation peak) is emitted during each positive half-period of the sinusoidal.

The present inventors have found that in short-pulse operation (e.g., pulse length <500 ps), the diode laser essentially emits simultaneously at every wavelength within its gain bandwidth for which a sufficiently strong optical feedback is provided (cavity loss is less than the available gain when carrier density reaches its maximum value), with the output spectrum shape closely following the spectral shape of the reflection of cavity mirrors, or any additional spectrally selective element in the cavity.

Figure 3A:
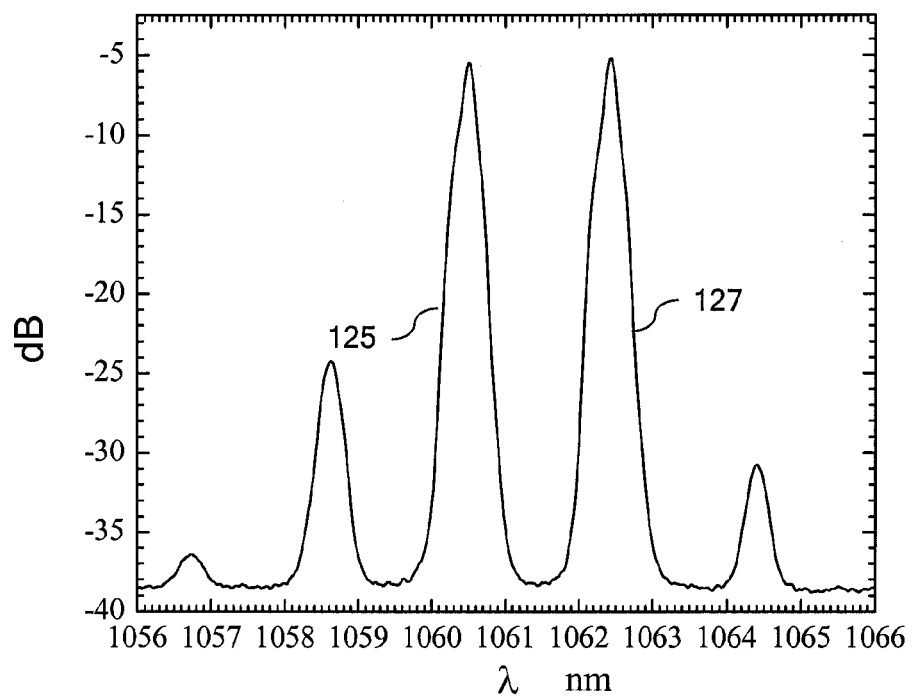
FIG. 3A is a graph depicting an optical spectrum of an output beam emitted from an optical source according to one or more embodiments shown and described herein.

As an example and not a limitation, a 2.25 mm long 1060 nm Fabry-Perot diode laser (1.75 mm long gain section and 0.5 mm long SA section) was placed in an external cavity with the external reflection provided by a Volume Bragg Grating (VBG). The VBG was designed to have two reflection peaks, approximately 10% in amplitude and 0.2 nm wide, at 1060.5 and 1062.4 nm The laser was operated in gain switching by supplying about 5 mA DC current to the SA section (keeping the SA slightly absorbing) and a superposition of 200 mA DC and 400 mA peak to peak sinusoidal drive current at 923 MHz to the gain section, and produced a train of approximately 30-ps long pulses with the average power of 65 mW and peak power of ~1.8 W. The output spectrum illustrated in FIG. 3A consisted of two equal strength main peaks and two additional much weaker peaks (caused by four-wave mixing inside the diode laser). The graph of FIG. 3A illustrates a pump beam having a first fundamental spectral peak 125 centered at approximately 1060.5 nm in wavelength, and a second fundamental spectral peak centered at approximately 1062.4 nm in wavelength. The two fundamental spectral peaks are therefore separated by approximately 1.9 nm The first and second fundamental spectral peaks have an optical frequency of $\omega_1$ and $\omega_2$ associated therewith, respectively. The position and width of the two main peaks nearly exactly reproduce the reflection spectrum of the VBG. Therefore, the output spectrum of a pulsed (Q- or gain-switched) DBR diode laser may be defined by the reflection spectrum of its DBR mirror.

Figure 3B:
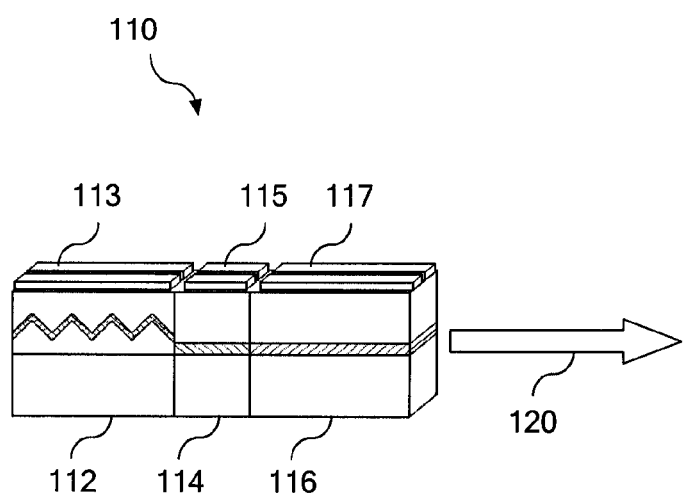
FIG. 3B is a schematic diagram of a DBR laser according to one or more embodiments shown and described herein.

An optical source 110 of one embodiment configured as a three-section DBR semiconductor laser is schematically illustrated in FIG. 3B. The semiconductor laser 110 may generally comprise a wavelength selection section 112, a phase-adjusting section 114, and a gain section 116. The wavelength selection section 112, which may also be referred to as the distributed Bragg reflector or DBR section of the semiconductor laser 110, typically comprises a first order or second order Bragg grating positioned outside the active region of the laser cavity. This section provides wavelength selection, as the grating acts as a mirror whose reflection coefficient depends on the wavelength. The gain section 116 of the semiconductor laser 110 provides the optical gain of the laser and the phase-adjusting section 114 may create an adjustable optical path length or phase shift between the gain material of the gain section 116 and the reflective structure of the wavelength selective section 112. As described in more detail below, the phase section may be configured as a saturable absorber to perform the function of gain and loss modulation. The wavelength selective section 112 may be provided in a number of suitable alternative configurations that may or may not employ a Bragg grating.

Respective control electrodes 113, 115, 117 are incorporated in the wavelength selective section 112, the phase matching section 114, the gain section 116, or combinations thereof, and are merely illustrated schematically in FIG. 3B. It is contemplated that the electrodes 113, 115, 117 may take a variety of forms. For example, the electrode 113 may be comprised of two individual electrodes that independently control the temperature of the first and section half parts of the DBR section in order to simultaneously generate two wavelengths. Electrode 113 may represent a single-section or a multi-section micro-heater. The control electrodes 113, 115, 117 can also be used to inject electrical current into the corresponding sections 112, 114, 116 of the semiconductor laser 110. In addition, a three-section DBR semiconductor laser may be configured in a variety of forms. For example, the DBR section may consist of two sections with two different grating periods, and the phase section may be between the two DBR sections such that the phase section can be used to balance the gain/loss of the two selected wavelengths.

The DBR section 112 of the semiconductor laser 110 provides a nearly equal reflection at two wavelengths in the vicinity of 1060 nm and separated by at least 0.5 nm ($\lambda\Delta_{IR}$). Any number of design approaches to achieve reflection at the two wavelengths may be employed, such as sampled gratings, superstructure gratings, gratings with periodic modulation of pitch and/or depth, gratings with a periodic phase shift, or use of a dual-grating DBR. When operated in gain/Q-switching mode, such DBR lasers can produce stable short-pulse output with nearly equal power in two spectral peaks.

Typically, in DBR lasers designed for continuous wave (CW) operation, the layer structure of the laser is the same in the wavelength selection, the phase-adjusting, and the gain sections. However, the phase-adjusting and the wavelength selection sections are typically subjected to a process known as quantum-well intermixing (QWI) that results in a bandgap increase making the two sections transparent for the light emitted by the unmodified gain section, thereby minimizing intra-cavity loss. The gain section is active, and converts injection current applied to its contact terminals into laser light. Injection current applied to the phase-adjusting section does not result in the emission or amplification of light (i.e., passive section), but rather changes the refractive index of the active layer, allowing for the fine adjustment of cavity modes. The wavelength selection section is also passive and is not supplied with injection current. To tune the fundamental spectral peak position of the DBR reflection, resistive heaters may be deposited on top or on the sides of the wavelength selection section to allow for the adjustment of its refractive index (and resonant wavelength) by changing the temperature.

Semiconductor lasers of the embodiments described herein may employ a modification of the above-described DBR laser design. In one embodiment, the phase matching section 114 does not undergo a QWI process. As a result, the phase matching section 114 may operate either as an amplifier (when supplied a positive above-threshold bias) or as a saturable absorber (by applying below threshold, zero or negative bias). In this embodiment, the phase matching section 114 is not operated for phase tuning (cavity mode shifting) but rather for additional loss/gain modulation. In this regard, the phase matching section of the embodiment illustrated in FIG. 3 is referred to as a saturable absorber section 114. The wavelength selection section 112 may either remain passive or become active (no QWI) and provide additional saturable absorption. The wavelength tuning may be achieved by the use of resistive heaters or, in the case of an active wavelength selection section 112, by injecting current into the wavelength selection section 112.

Pulsed operation of the semiconductor laser 110 may equalize the output power between the two desired pump wavelengths at the two fundamental spectral peaks, as well as compensate for reduced wavelength-conversion efficiency in the case of multiple-wavelength frequency conversion as described in more detail below. In a gain-switching pulsed mode, as mentioned above, a sinusoidal (or other periodic) drive signal may be applied to the gain section 116 resulting in a short pulse emitted during each positive half-period. A DC bias may be applied to the gain section in addition to the periodic drive. A DC bias may also be applied to the saturable absorber 114 section and may be adjusted to produce the level of saturable absorption optimum for emitting the high quality pulses with maximum peak power. In a Q-switching pulsed mode, the gain section 116 may be driven with a DC signal and the periodic bias may be applied to the saturable absorber section 114, forcing it to serve as a "shutter" with a short pulse still emitted during each positive half period (when the absorption is low or negative). In some embodiments, a hybrid driving approach may be utilized where both gain and saturable absorber sections 116, 114 receive in-phase periodic drive current, as disclosed in U.S. patent application Ser. No. 12/730,482, filed Mar. 24, 2010, which is incorporated in its entirety by reference herein. The hybrid driving approach may result in the best possible pulse quality for the least amount of RF power required to drive the semiconductor laser 110. Any of the three driving approaches described above can be applied to the DBR semiconductor laser to produce the two-wavelength pulse output. The choice as to which driving method is to be utilized depends on the details of the laser design and application requirements.

Additionally, the pump laser may rely on inhomogeneous spectral broadening instead of short pulsation to produce fundamental output spectrum composed of two or more simultaneously emitted fundamental spectral peaks. For example, embodiments may utilize a DBR or DFB quantum-dot laser, or optically-pumped solid-state laser with inhomogeneous broadening with some multi-wavelength-selecting optical element, such as a volume Bragg grating with dual-wavelength or multi-wavelength reflectivity. Such lasers with inhomogeneously broadened spectrum of spontaneous emission may also be used in continuous-wave or quasi-continuous-wave (long-pulse) regime of emission.

Referring once again to FIG. 1, the pump beam 120 having two fundamental spectral peaks may be focused and directed toward the wavelength conversion device 130 by coupling optics 121. In the embodiment shown in FIG. 1, the coupling optics 121 generally comprises a first lens 122a that collimates the pump beam 120 emitted by the semiconductor laser 110 and a second lens 122b that focuses the pump beam 120 into the waveguide portion of the wavelength conversion device 130. However, it should be understood that other coupling methods and devices may be used. Further, the wavelength conversion device may comprise a bulk nonlinear optical material, or be incorporated into the laser 110 as an intra-cavity wavelength conversion device. The lenses 122a, 122b may be coupled to an actuator (not shown) for adjusting the position of the lenses 122a, 122b in the x- and y-directions such that the positions of the lenses are adjustable. Adjusting the position of the lens in the x- and y-directions may facilitate positioning the pump beam 120 along the input facet of the wavelength conversion device 130 and, more specifically, on the waveguide portion of the wavelength conversion device, such that the pump beam 120 is aligned with the waveguide portion and the frequency-converted output of the wavelength conversion device 130 is optimized. Although the optical system 100 illustrated in FIG. 1 has a substantially linear orientation, other orientations and configurations are also possible. For example, the semiconductor laser and wavelength conversion device may be oriented such that the optical path of the pump beam and frequency-converted output beam is a folded optical path.

The wavelength conversion device 130 generally comprises an input facet 131 and an output facet 138. The wavelength conversion device may include a nonlinear optical medium with phase-modulated phase-matching, such that the spectrum of its nonlinear optical response contains multiple phase-matching peaks, properly spaced in wavelength to provide phase-matching for the various possible optical frequency-mixing processes between the two or more fundamental spectral peaks. The phase-modulation of the phase-matching may be obtained by modulating the nonlinear, linear, or both optical properties of the nonlinear optical medium used for frequency mixing.

A waveguide portion (not shown) of the wavelength conversion device 130 extends from the input facet 131 to the output facet 138. The wavelength conversion device 130 may comprise a crystal formed of a nonlinear optical material having a plurality of domains 132 with alternating sign of the nonlinear optical response. Nonlinear optical materials suitable for a wavelength conversion device may include, but are not limited to, poled doped or non-doped lithium niobate, poled doped or non-doped lithium tantalate, and poled doped or non-doped potassium titanyl phosphate, for example.

The light propagation in the wavelength conversion device 130 may be free-space or optical waveguide propagation. The wavelength conversion device 130 may comprise a crystal utilizing a method of phase-matching, including, but not limited to, birefringent, inter-modal, or quasi-phase-matching. The role of phase-matching is to produce constructive interference of the electromagnetic waves at the frequency-converted optical frequency generated by the nonlinear polarization produced by the fundamental optical field along the optical path. The phase-modulation of the phase-matching serves to distribute the phase-matching into several phase-matching spectral peaks, corresponding to different optical frequencies, such that each of the phase-matching peaks produces partial phase-matching. The term partial here means that for a particular optical frequency corresponding to such a partial phase-matching peak, the frequency up-converted optical waves produced by some, but not necessarily all regions along the crystal, interfere constructively to produce substantially non-zero up-converted signal on the output. The phase-modulation thus reduces the maximum phase-matching at the optical frequency of the frequency-conversion process phase-matched in the basic, un-modulated design to partial phase-matching or no phase-matching, while at the same time allowing partial phase-matching at other optical frequencies for which no phase-matching was provided by the un-modulated design. In the low-conversion limit, the spectrum of the phase-modulated phase-matching response to a tuned monochromatic input signal is proportional to the Fourier-transform of the phase-modulating function (PMF), irrespective of the physical mechanism used for phase matching. At high-level of energy conversion to the up-converted frequency range, the spectrum of the up-converted signal deviates from the Fourier-transform of the PMF. In many cases, this deviation may lead to a minor deterioration in the speckle contrast reduction. If this deterioration becomes important, the magnitude ratio of the phase-matching peaks may be adjusted by changing the PMF such that the spectral response at high conversion leads to better reduction of speckle contrast, while the speckle contrast at lower conversion may be somewhat higher, e.g., when maximum speckle reduction may be important at higher optical power.

The PMF imparts spatially varying phase on the frequency up-converted optical field. This is achieved by modulating the phase or spatial location of the nonlinear polarization (for example by modulating the poling of quasi-phase matching crystals) and/or by modulating the phase delay of up-converted waves generated at different locations along the crystal by modulating the (effective) refractive index of the medium or optical path length that they traverse. Some of the techniques for phase modulation, such as longitudinal shifting of the positions of inverted domains of quasi-periodic poling, may be interpreted as embodiments of the nonlinear or linear path of modulation.

Generally, the nonlinear medium is designed to include phase-matching for three nonlinear optical processes: 1) second harmonic generation (SHG) of the first optical frequency $\omega_1$ of the pump beam, 2) sum-frequency generation (SFG) of the first and second optical frequencies $\omega_1$ and $\omega_2$ of the pump beam, and 3) SHG of the second optical frequency of the pump beam. Therefore, the frequency-converted output beam may comprise three frequency-converted spectral peaks having frequencies of $2\omega_1$, $(\omega_1+\omega_2)$ and $2\omega_2$ (illustrated in FIG. 2 as 142, 144, and 146, respectively). As an example, and not a limitation, approximately 42 mW of the infrared light depicted in FIG. 3A and described above with regard to a Fabry-Perot laser was optically coupled in a wavelength conversion device comprising a quasi-periodically poled waveguide lithium niobate device according to the continuous phase modulation function design illustrated in FIGS. 12-14B (described in detail below), and produced the green light with the output spectrum shown in FIG. 2, having three nearly equal frequency-converted spectral peaks 142, 144, 146 (the two much weaker satellite peaks are due to amplified spontaneous emission background converting to a higher order green light modes of the waveguide, or sum-frequency mixing between the main pump IR spectral peaks, on the one hand, and the FWM components, on the other, facilitated by the unused quasi-phasematching (QPM) side-peaks of the nonlinear waveguide).

Quasi-phase matching may be achieved by introducing periodic or quasi-periodic sign reversal of the nonlinear optical response, for example, by quasi-periodically inverted ferroelectric domains 132 within the nonlinear optical material (e.g., within the waveguide region of the crystal). The quasi-periodic poling provides the quasi-periodic inverting of the sign of the nonlinear coefficient of the wavelength conversion device 130 in order to insure constructive addition of the nonlinear optical response at the frequencies of interest generated along the device length. As illustrated in FIG. 1, the domains 132 may have either positive or negative nonlinear polarization associated therewith. The sign of the nonlinear response of the domains may alternate approximately periodically along a longitudinal length of the crystal. As described in more detail below, the periodicity of the plurality of poling domains may be phase-modulated such that the domains are quasi-periodically poled. It is noted that the size of the quasi-periodic domains 132 is exaggerated in FIG. 1 for illustrative purposes. Further, the wavelength conversion device 130 is only partially illustrated in FIG. 1.

Frequency-converted spectral peaks of $2\omega_1$, $(\omega_1+\omega_2)$ and $2\omega_2$ may yield three simultaneous speckle patterns that add up randomly to reduce the appearance of speckle. For maximum reduction of speckle contrast by intensity addition of several independent speckle patterns, the optical power should be approximately evenly distributed among the frequency-converted wavelengths of the output beam. For the case where three independent speckle patterns are produced by three frequency-converted spectral peaks of the frequency-converted output, the optical power in each frequency-converted spectral peak should be approximately the same. However, some speckle reduction may be achieved when the frequency-converted spectral peaks are not equal such that a speckle pattern associated with the frequency-converted spectral peak having a greater power than the remaining frequency-converted spectral peaks may be more pronounced to an observer. The three frequency-converted spectral peaks are produced by optical frequency mixing of two fundamental spectral peaks emitted by the semiconductor laser at optical frequencies $\omega_1$ and $\omega_2$ by second-order nonlinear interaction. The frequency conversion process may be described by the equations:

$$E_1(\omega_1) = E_{1A} e^{(i\omega_1 t)}, \qquad \text{Eq. (2),}$$

$$E_2(\omega_2) = E_{2A} e^{(i\omega_2 t)}, \qquad \text{Eq. (3), and}$$

$$E_{out}^{nl} \propto d_{eff}(E_1(\omega_1)+E_2(\omega_2))^2 \propto d_{eff}E_{1A}^2 e^{(i2\omega_1 t)} + d_{eff}E_{2A}^2 e^{(i2\omega_2 t)} + 2d_{eff}E_{1A}E_{2A}e^{(i(\omega_1+\omega_2)t)}, \qquad \text{Eq. (4).}$$

The above equations demonstrate that the frequency-converted (nonlinear) output can contain optical power at frequencies $2\omega_1$, $(\omega_1+\omega_2)$ and $2\omega_2$. The outputs at $2\omega_1$ and $2\omega_2$ are the second harmonic (SH) of the optical frequencies of the input beam at $\omega_1$ and $\omega_2$, respectively, while the output at $(\omega_1+\omega_2)$ is the sum-frequency (SF) of the two fundamental optical frequencies. It can be seen that for the same nonlinear coefficient $d_{eff}$ the amplitude of the sum-frequency output is twice as strong as the amplitudes of each of the second harmonic outputs. Because the optical power is proportional to the square of the electric field amplitude, the sum-frequency spectral peak at $(\omega_1+\omega_2)$ would contain four times the power of each of the second harmonic spectral peaks $2\omega_1$ and $2\omega_2$.

However, the optical power of the three frequency-converted spectral peaks should be approximately equal such that one or more speckle patterns are not significantly more pronounced at the projection surface. For example, if the optical power of the sum-frequency output is four times greater than the two second harmonic outputs, the speckle pattern produced by the sum-frequency output will be more pronounced to an observer. In some embodiments, however, the frequency-converted spectral peak associated with sum-frequency generation may have greater power than the frequency-converted spectral peaks associated with second harmonic generation to increase overall conversion efficiency. In this case, some speckle contrast reduction may be sacrificed for increased conversion efficiency of the wavelength conversion device.

Embodiments described herein may approximately equalize the optical power of all three frequency-converted spectral peaks of the wavelength conversion device by manipulation of the phase-matching properties of the nonlinear optical medium. Wavelength conversion devices utilized for second harmonic generation are poled at a phase-matching periodicity to phase-match the frequency up-converted light produced at different locations along the propagation direction. To illustrate, the spectral intensity response of a QPM structure with periodically inverted ferroelectric domains in lithium niobate with a fixed phase-matching period $\Lambda$ has quasi-phase matching peaks in wave-vector space at $m2\pi/\Lambda$ where $m=1$, 2, 3, . . . . The quasi-phase matching peak characterized by $m=1$ has the highest magnitude of each of the quasi-phase matching peaks. The relative magnitude of intensity of the quasi-phase matching peaks corresponding to different orders m decreases as $1/m^2$. Therefore, for most efficient quasi-phase matching, the quasi-phase matching peak where $m=1$ should be at the infrared wavelength of the pump beam emitted by the semiconductor laser to produce a frequency-converted output beam. It should be understood that the phase-matching concepts described below may also be applied to phase-matching techniques other than quasi-phase matching (e.g., phase matching by use of bulk birefringent crystals).

For illustration purposes, quasi-phase matching may be described in wave-vector (k-vector) space. In the case of second harmonic generation and sum-frequency generation, the source of the frequency up-converted light is the nonlinear polarization described by the right-hand side of Eq. (4). At a particular moment in time, the phase distribution of this source wave at an example frequency $2\omega$ along the propagation direction can be described with a wave-vector $2k_\omega=2\omega n_\omega/c=4\pi n_\omega/\lambda_\omega$, where c is the speed of light, $\lambda_\omega$ is the wavelength in vacuum of an optical wave with frequency $\omega$, and $n_\omega$ is the refractive index of the nonlinear optical medium at the optical frequency $\omega$ of the pump wave producing the nonlinear polarization. In the case of waveguide propagation and interaction, $n_\omega$ is the effective index of the waveguide mode used to describe the propagation of the fundamental-frequency (pump) wave causing the nonlinear polarization. At the same time, the free-propagating frequency up-converted light at frequency $2\omega$ generated at any location along the propagation direction can be described by a plane wave with wave-vector $k_{2\omega}=2\omega n_{2\omega}/c=2\pi n_{2\omega}/\lambda_{2\omega}=4\pi n_{2\omega}/\lambda_\omega$, where $n_{2\omega}$ is the (effective) refractive index of the medium at the second harmonic frequency $2\omega$, and $\lambda_{2\omega}=\lambda_\omega/2$ is the wavelength in a vacuum of the second harmonic. It should be understood that free-propagating frequency up-converted light also includes the case of waveguide propagation, where the optical wave is confined in the transverse dimensions. If the wave-vector of the source wave is the same as the wave-vector of the free-propagating waves, then constructing interference of the generated second harmonic waves is observed along the device length, and the second harmonic power grows. Otherwise, the second harmonic power oscillates along the length, reaching only a small maximum value dictated by the wave-vector mismatch $$\Delta k=k_{2\omega}-2k_\omega, \quad (Eq. 5).$$

In cases where $\Delta k$ is non-zero, one way to allow the second harmonic power to grow is to use quasi-phase matching as described above. A periodic reversal of the sign of the nonlinear coefficient with period $\Lambda$ and associated k-vector $K_g=2\pi/\Lambda$ leads to a periodic compensation of the phase mismatch caused by $\Delta k$. Quasi-phase matching is achieved when:

$$k_{2\omega}-2k_\omega\pm mK_g=0, \quad (Eq. 6),$$

whereby the wave-vector mis-match is compensated. Here m can be any integer and signifies the quasi-phase matching order. The same type of quasi-phase matching is applicable for the case of sum-frequency generation, but in that case Eq. 5 may be replaced by:

$$\Delta k=k_{\omega_1+\omega_2}-k_{\omega_1}-k_{\omega_2}, \quad (Eq. 7),$$

and the QPM condition (Eq. 6) may be replaced by $$k_{\omega_1+\omega_2}-k_{\omega_1}-k_{\omega_2}\pm mK_g=0, \quad (Eq. 8).$$

As defined by Eq. 5, associated with each fundamental optical wavelength $\lambda_\omega$ is a wave-vector mismatch $\Delta k$ for frequency doubling of the related optical field. In a similar way, associated with each two fundamental wavelengths $\lambda_1$ and $\lambda_2$ is a wave-vector mismatch $\Delta k_{1,2}$ for generation of the sum of their optical frequencies. In the case of type-I quasi-phase matching for utilizing the $d_{33}$ nonlinear coefficient of lithium niobate, when the fundamental wavelength is on the order of 1060 nm, $\Delta k$ is significant, on the order of 9000 cm$^{-1}$. In other cases of phase-matching, such as birefringent phase-matching, $\Delta k$ is 0. When describing QPM device design in terms of a carrier periodicity and its phase modulation, it may be convenient to define in k-vector space a deviation k-vector by the equation:

$$\delta k=\Delta k\pm K_c, \quad (Eq. 9),$$

where $K_c$ is the wave-vector describing the carrier periodicity of QPM. The plus/minus sign in the right-hand-side of Eq. 9 is chosen such that $\delta k=0$ when the phase-matching is not modulated. In this manner, associated with each fundamental wavelength and each nonlinear process (SHG, SFG) is a particular value of $\delta k$. Since for a particular design of the nonlinear device the detuning from the central (design) optical frequency determines the associated phase mismatch, a spectral response of a nonlinear optical device may be designed and plotted as a function of $\delta k$.

The mapping between $\delta k$ and the fundamental wavelength may be given by the relations $$\frac{d\Delta k}{d\lambda_\omega}\equiv\frac{d\delta k}{d\lambda_\omega}=-\frac{4\pi}{\lambda_\omega^2}(n_{2\omega}^g-n_\omega^g), \quad (Eq. 10),$$

where $n^g_\omega$ and $n^g_{2\omega}$ stand for the group index at the fundamental and at the second harmonic frequencies. Group index at frequency w or wavelength $\lambda$ may be defined as:

$$n^g=n+\omega\frac{dn}{d\omega}=n-\lambda\frac{dn}{d\lambda}, \quad (Eq. 11).$$

A truly periodically poled device of length L will have a spectral response curve in terms of $\delta k$ described with a sin c$^2$ function with a full-width at half-maximum (FWHM) equal to $1.772\pi/L$. In terms of fundamental wavelength, the FWHM is then:

$$\Delta\lambda_{FWHM}=\frac{0.443}{n_{2\omega}^g-n_\omega^g}\frac{\lambda^2}{L}, \quad (Eq. 12).$$

Utilizing the above, wavelength conversion devices of the present disclosure convert the frequency of a pump beam having at least two fundamental spectral peaks into an output beam having at least three frequency-converted spectral peaks. Therefore, the wavelength conversion device should provide three or more phase matching peaks that yield an output beam having frequency-converted spectral peaks of frequency $2\omega_1$, $(\omega_1+\omega_2)$ and $2\omega_2$ and approximately equal optical power. Focusing on one of the phase-matching spectral peaks described above with respect to second harmonic generation by quasi-phase matching (using QPM order m=1 for example), its shape can be changed from a single peak to a split peak with multiple spectral components by altering the character of the QPM crystal domain structure from strictly periodic at the phase-matching periodicity $\Lambda$ to a quasi-periodic structure. Several techniques for manipulating the shape of the QPM peak may be utilized, including, but not limited to, QPM gratings with frequency chirp, periodic or aperiodic superlattice, quasi-periodic superlattice, non-periodic superlattice, and phase modulation. Additionally, techniques may utilize computer optimization to obtain a QPM structure with a desired spectral response by utilizing the Fourier-transform relation between the spectral response and the distribution of nonlinear susceptibility in the physical space.

Figure 6:
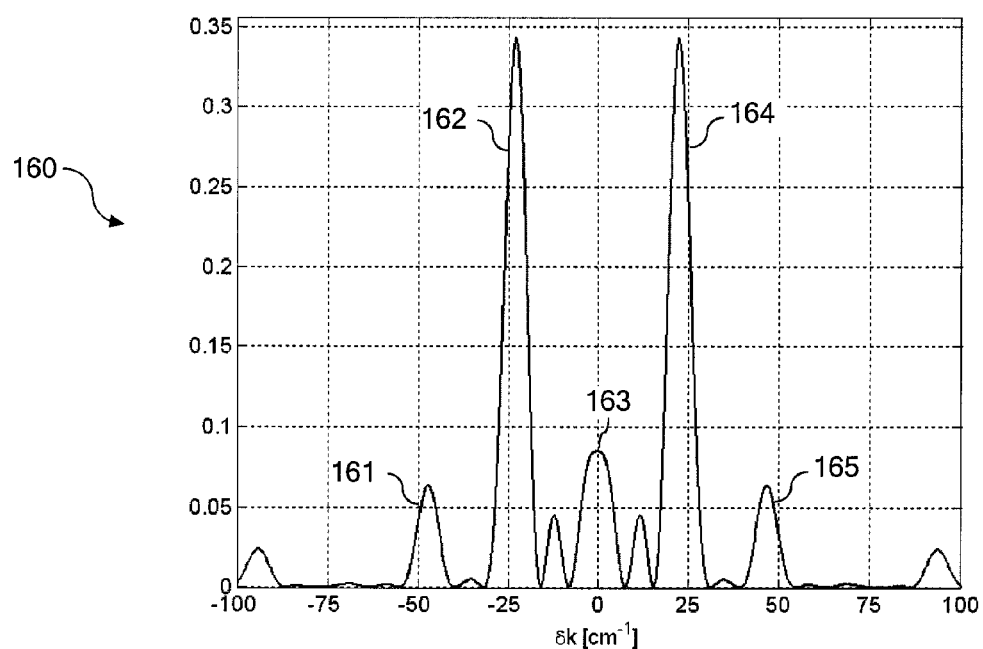
FIG. 6 is a graph of a spectral response in wave-vector space of a wavelength conversion device having a phase-modulated periodicity defined in part by the discrete phase modulation function illustrated in FIG. 4 according to one or more embodiments shown and described herein.

Referring generally to FIG. 6, a spectral response of a wavelength conversion device in terms of $\delta k$ according to one embodiment is illustrated. The spectral response is characterized by at least three phase matching peaks (e.g., quasi-phase matching peaks): first quasi-phase matching peak 162, second quasi-phase matching peak 163 and third quasi-phase matching peak 164. The first quasi-phase matching peak 162 corresponds to a first frequency-converted spectral peak 142 having a frequency of $2\omega_1$ produced by second harmonic generation (FIG. 2), the second quasi-phase matching peak 163 corresponds to a second frequency-converted spectral peak 144 having a frequency of $(\omega_1+\omega_2)$ by sum-frequency generation, and the third quasi-phase matching peak 164 corresponds to a third frequency-converted spectral peak 146 having a frequency of $2\omega_2$ produced by second harmonic generation.

For the specific case of frequency up-conversion by mixing two fundamental spectral peaks to produce three frequency-converted spectral peaks 142, 144 and 146, there may be three cases distinguished on the basis of the longitudinal-mode structure of the pump optical spectrum—single-mode, multi-mode, and broad continuous-spectrum. The latter case includes a situation in which the pump optical spectrum is not well represented by one or more well-defined spectral lines, for example due to excessive frequency chirp.

Single-mode fundamental spectral peaks will be described first herein followed by a discussion of multi-mode embodiments. In single mode, each of the two fundamental peaks consists of a single longitudinal laser mode with narrow spectral line width. Since the linewidth of the pump mode is typically much narrower than the spectral response features of the wavelength conversion device, the widths of the spectral peaks may not be of primary importance. Therefore, optimization may involve maximizing the peak intensity magnitude of the three quasi-phase matching peaks 162, 163 and 164, while keeping the magnitude response ratio approximately at 1:0.25:1 to equalize the output power at the three frequency converted wavelengths such that speckle contrast is significantly attenuated. It is noted that care should be taken to ensure that the quasi-phase matching peaks are positioned accurately in $\Delta k$-space. While the sum-frequency $\omega_1+\omega_2$ is exactly mid-way between the second-harmonic frequencies $2\omega_1$ and $2\omega_2$, the wave-vector mismatch for the sum-frequency generation process may be slightly shifted with respect to the average wave-vector mismatch for the two second harmonic generation processes due to material and waveguide dispersion. This shift increases with increasing the frequency spacing between the two fundamental peaks. This shift may be non-negligible when it becomes comparable to the width of the second spectral peak 163 corresponding to the sum-frequency generation nonlinear process.

Modulation of the phase-matching periodicity may be utilized to obtain a wavelength conversion device having three spectral peaks equally spaced in $\delta k$ and having the desired response ratio to produce three frequency-converted spectral peaks having substantially equal optical power. The wave-vector mismatch $\Delta k$ between the infrared (fundamental) and converted (second harmonic) light is several thousand $cm^{-1}$. To compensate for this mismatch, a periodic poling with a short quasi-phase matching period $\Lambda$ and a wave-vector $K_c$ of several thousand $cm^{-1}$ matching $\Delta k$ may be required to eliminate the phase mismatch. The result would be a single spectral peak centered at $\delta k=0$ as described above regarding second harmonic generation. The quasi-phase matching period $\Lambda$ may be referred to as the underlying carrier periodicity.

To obtain three quasi-phase matching peaks, a phase modulation function (PMF) may be applied to the carrier periodicity to achieve a phase-modulated periodicity. The phase-modulated periodicity, when applied to the nonlinear optical material in the form of quasi-periodic poling domains, has the effect of splitting the single spectral peak centered at $\delta k=0$ into multiple spectral peaks, thereby producing side bands (162, 164) equally spaced adjacent the center spectral peak 163 (FIG. 6). The inverted domains are referred to as quasi-periodic because the plurality of domains as a whole are not truly periodic when modulated by the PMF. The PMF has a very large period compared with the QPM period $\Lambda$ (i.e., the carrier periodicity) and therefore a much smaller k-vector. The PMF introduces a small perturbation on the relative positions of the poling domains. As an example, if the first and third side spectral peaks 162 and 164 are desired to be 28 $cm^{-1}$ from center second quasi-phase matching peak 163, a modulation with a k-vector of 28 $cm^{-1}$ may be applied. To apply the phase-modulation function to the periodic poling, the positions of all inverted domains along the propagation direction may be shifted by a distance proportional to the local value of the PMF. The proportionality constant is such that a phase shift of $\pi$ dictated by the PMF corresponds to a longitudinal shift of $0.5\Lambda$ for the inverted domain. If the phase-modulating function is $f(x)$, then the longitudinal shift of the position of the inverted domain at location x along the propagation direction is $\Lambda f(x)/(2\pi)$. It is to be understood that a description of the same device implementation may be given in terms of frequency (period) modulation.

If the pump spectral peaks are symmetrically located around a center-wavelength $\lambda$ and spaced in (vacuum) wavelength by $\Delta\lambda$, then a periodic PMF that can split the phase-matching peak into components that will allow the generation of up-converted radiation at wavelengths $0.5(\lambda-0.5\Delta\lambda)$, $0.5\lambda$, and $0.5(\lambda+0.5\Delta\lambda)$, should have a period of:

$$\Lambda_{PM} = \frac{2\pi}{K_{PM}} = \frac{\lambda^2}{\Delta\lambda(n_{2\omega}^g - n_{\omega}^g)},$$ Eq (13).

It is to be understood that the periodic phase-modulation is only one of a variety of phase-modulating functions that may be utilized for effective speckle reduction. Though the periodic phase-modulation can provide near-optimum response in terms of compromise between speckle reduction and conversion efficiency, other, aperiodic PMF's may also be used to produce multi-peak up-conversion spectral response, where the positions and magnitudes of the quasi-phase matching peaks may be slightly altered compared to the periodic modulation case, while still providing adequate performance for substantial speckle reduction. It is the adequate wavelength spacing and the distribution of magnitudes of the quasi-phase matching peaks that may provide optimized speckle reduction and conversion efficiency.

In an alternative embodiment, a phase-modulating function can be applied to the effective refractive index, without interfering with the periodic poling. For example, by slowly varying the width, thickness, or refractive index dispersion of the waveguide (in case of waveguide interaction) δk may be varied periodically, thereby producing multiple quasi-phase-matching peaks in the spectral response without altering the truly periodic poling. This technique may also be applied for phase-matched interactions relying on other means than periodic sign reversal of the nonlinear coefficient, such as birefringent phase-matching or intermodal phase-matching (where waveguide dispersion is used to compensate material dispersion).

In the case of bulk crystals with birefringent phase-matching or with QPM, periodic variation of the refractive index by temperature, stress, or electric field can also be applied for continuous phase modulation. The modulation of linear optical properties may be produced by material composition, temperature, electric field, mechanical stress, or other stress factors. In the case of waveguide propagation, periodic modulation of a waveguide property such as the waveguide width, thickness, or material composition, can effect periodic modulation of phase-matching via the effect on the effective indices of the optical modes.

In another embodiment, multiple crystals may be stacked in a sequence along the direction of light propagation, separated by thin layers of optically transparent material. The thickness of a separating layer is selected to provide a phase-difference of $(2l+1)\pi$ between the fundamental and the up-converted optical frequencies for discrete phase-modulation, where $l=0, 1, 2, 3 \ldots$. Alternatively, blocks of different media can be stacked together, with different nonlinear and linear optical properties, leading to modulation of the phase-matching.

Figure 4:
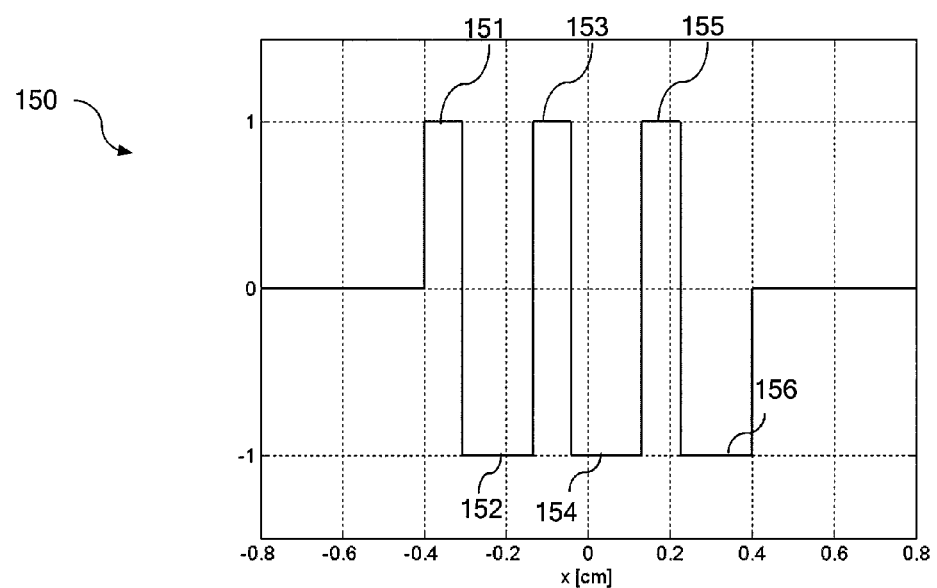
FIG. 4 is a graph of a discrete phase modulation function according to one or more embodiments shown and described herein.
Figure 5:
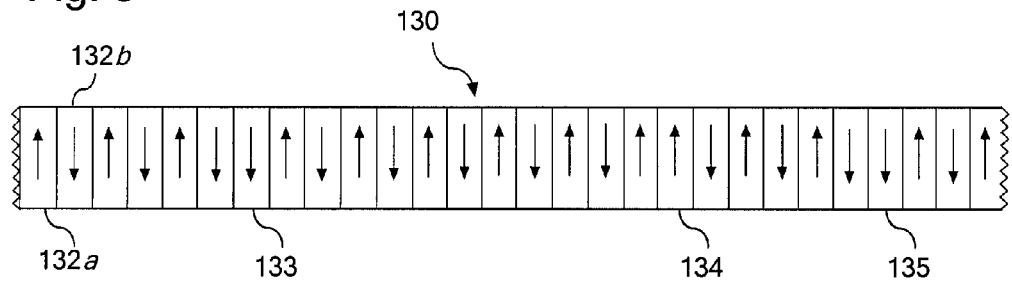
FIG. 5 is a schematic diagram of a wavelength conversion device having a phase-modulated periodicity defined in part by the discrete phase modulation function illustrated in FIG. 4 according to one or more embodiments shown and described herein.

Referring now to FIGS. 4 and 5, one embodiment of a phase modulation function and resulting plurality of poling domains having a phase-modulated periodicity is illustrated. FIG. 4 illustrates a discrete PMF 150 that consists of a rectangular wave. The discrete PMF 150 effectuates a large-period sign reversal sequence. Every sign reversal is equivalent to a discrete phase jump of π. For the case of QPM via periodic poling, this periodic sign reversal is superimposed on the periodic poling with phase matching period Λ. As illustrated in FIG. 5, sign reversal of the nonlinear coefficient is equivalent to dielectric polarization reversal in a ferroelectric crystal such as lithium niobate. The periodic sign flip is achieved by flipping the orientation of one or more domains with respect to their nominal orientation as characterized by the phase matching period Λ.

The wavelength conversion device illustrated and characterized by FIGS. 4-6 is an 8 mm-long quasi-periodically poled lithium niobate crystal. The discrete PMF 150 has a period of sign-reversal of about 2.67 mm, which is ⅓ of the full device length. Phase-matching is not provided outside of the 8-mm long region. Mathematically, the nonlinear optical coefficient outside of the phase-matched region can be assumed 0 even if the nonlinear medium extends outside of that region. The duty cycle of the discrete PMF 150 may be altered to achieve the desired spacing and magnitude of the quasi-phase matching peaks and corresponding three frequency-converted spectral peaks. The duty cycle of the discrete PMF 150 of the embodiment illustrated in FIG. 4 is approximately 0.354 to achieve the 4:1:4 response ratio of the three quasi-phase matching peaks 162, 163 and 164 illustrated in FIG. 6.

FIG. 5 illustrates a portion of the plurality of domains of a wavelength conversion device 130. It is to be understood that FIG. 5 is not drawn to scale and is for illustrative purposes only. Domains having a first crystallographic orientation 132a (e.g., a positive sign) are indicated by an up-arrow ↑ while domains having a second crystallographic orientation 132b (e.g., a negative sign) are indicated by a down-arrow ↓. Referring to FIG. 4, x=−0.4 on the x-axis corresponds to the beginning of the phase-matching region of the wavelength conversion device while x=0.4 is the end of the phase-matching region of the wavelength conversion device 130. Portion 151 of the discrete phase modulation function 150 is characterized by a "1" value. In this region, the domains 132a, 132b alternate periodically in accordance with the phase matching period Λ. However, at the transition from region 151 to portion 152, the sign or orientation of the domains is flipped. As illustrated in FIG. 5, domain 133 has a second crystallographic orientation rather than the first such that the remaining domains within portion 152 are phase-shifted by π with respect to normal positions as defined by the phase matching period Λ (i.e., the carrier periodicity). The domains are shifted longitudinally along x by 0.5Λ (which in this case is equivalent to flipping the orientation (inverting the sign) of the domains in the region to be phase-shifted). At the transition between portion 152 and 153, the orientation of domain 134 is flipped such that the domains within portion 153 alternate periodically in accordance with the phase matching period Λ. Similarly, the sign or orientation of domain 135 is flipped at the transition between 153 and 154. Therefore, the domains are poled at the normal positions defined by carrier periodicity at portions 151, 153 and 155 of the discrete phase modulation function 150, and the domains are shifted by 0.5Λ with respect to the normal positions at portions 152, 154 and 156 of the discrete phase modulation function 150.

FIG. 6 illustrates the spectral response 160 of a wavelength conversion device that is poled at a phase-modulated periodicity that is defined by a phase matching period Λ and modified by multiplying the periodic domain sign sequence by the PMF depicted in FIG. 5. The domain width of each domain is approximately 3.2 μm. The wavelength conversion device incorporates an MgO-doped congruent lithium niobate waveguide and quasi-phase matching is used to allow type I phase-matching using the $d_{33}$ component of the second-order nonlinear susceptibility. The spectral response 160 is illustrated in FIG. 6 as a function of δk. The magnitudes of the three main quasi-phase matching peaks 162, 163 and 164 are 0.343, 0.0849, and 0.343, respectfully. The two outer quasi-phase matching peaks 161 and 165 do not contribute to the frequency-converted output. The first and third quasi-phase matching peaks 162 and 164 are separated by 45 cm-1 in Δk-space. These quasi-phase matching peaks 162 and 164 would quasi-phase match the frequency doubling of two corresponding infrared wavelengths around 1060 nm that are separated by about 1.59 nm in wavelength. The second quasi-phase matching peak 163 would quasi-phase match the sum-frequency mixing of the two infrared wavelengths. Assuming that the laser power P is equally distributed between the two pump modes, the overall efficiency of the simultaneous second harmonic generation and sum-frequency generation processes may be given by:

$$P_{out}=0.343\eta_0^*(P/2)^2+4^*0.0849^*\eta_0^*(P/2)^2+0.343\eta_0^* \\ (P/2)^2=0.256\eta_0 P^2, \quad \text{Eq. (13),}$$

where $\eta_0$ is the second harmonic generation efficiency of a uniformly periodically-poled quasi-phase matching grating of the same length with a single quasi-phase matching peak. If the factor of 0.256 renders the conversion efficiency too low, the efficiency may be recovered by increase of the peak power in pulsed operation. The external conversion efficiency of the nonlinear optical device, defined as the ratio of the average power of the frequency up-converted output signal and the average fundamental (pump) input power, may be the most important parameter describing the performance of nonlinear device as part of the overall optical system. The external conversion efficiency is proportional to pump power in the low-conversion regime and saturates at high conversion. A factor of 4 of external efficiency decrease may be compensated by increasing the peak fundamental power by a factor of 4 or more. In addition, an additional factor of 1.4-2 should be applied when the pulse shape is not rectangular, but a more typical laser pulse shape such as Gaussian, hyperbolic secant, or Lorentzian.

A PMF represented by a periodic sign reversal with period $\Lambda_{PM}$ and 50% duty cycle leads to splitting of the QPM spectral peaks into two components, each having a relative magnitude of approximately 0.41 compared to a truly periodic QPM structure of the same length. In cases where the length of the QPM structure equals only a few periods of the PMF, deviations of the relative magnitude from 0.41 can be observed, depending on how the PMF is truncated at the ends of the QPM structure. Favorable truncation occurs when the PMF is symmetric with respect to the center of the QPM structure and the length L of the QPM structure equals approximately $(m+0.3)\Lambda_{PM}$, where m is positive integer. For example, when $L=(m+0.3)\Lambda_{PM}$, the relative response magnitude of the two peaks is about 0.474, 0.442, 0.431, and 0.424 for the cases m=1, 2, 3, and 4, respectively. If a sign-reversal QPM structure with only two quasi-phase matching peaks is used to frequency double each of the pump modes without providing phase-matching for the sum-frequency generation, then, even though the normalized efficiency for each of the two second harmonic generation processes would be higher (about 0.41±0.06 versus about 0.343), the overall frequency converted output would be:

$$P_{out}=2*0.4\eta_0*(P/2)^2=0.205\eta_0 P^2, \quad \text{Eq. (14).}$$

A comparison of equations (13) and (14) illustrate that utilizing an optimized QPM structure with three quasi-phase matching peaks would not only help increase the speckle-reduction factor from about 1/1.41 to about 1/1.73, but also boost the overall nonlinear conversion efficiency by about 25% on average compared with a structure having only two quasi-phase matching peaks. Even if the frequency shift of the sum-frequency generation wave-vector mismatch $\Delta k_{SFG}$ limits the spacing of the quasi-phase matching peaks such that the full speckle-reduction factor is not obtained, the boost in conversion efficiency alone may provide a benefit in the case where two spectrally separated pump laser modes are generated simultaneously. As an example and not a limitation, for an optimum choice of PMF period or nonlinear device length, $L=(m+0.3)\Lambda_{PM}$, a periodic sign-reversal PMF with duty cycle of 39% produces three central peaks with magnitudes of approximately 0.342, 0.071, and 0.0342 relative to a non-modulated phase-matching device. If the duty cycle is 28%, then the relative peak magnitudes are approximately equal at 0.247. Thus, the range of duty cycles between 27% and 29% corresponds to a range of response peak ratios capable to provide significant speckle reduction. In cases where the magnitude of the central phase-matching peak is similar to the magnitudes of the two side peaks, the central frequency-converted output peak may contain somewhat higher optical power than the first and the third (SHG) output peaks, leading to an improvement in overall frequency conversion efficiency. If the power of the central peak is within a factor of two of the powers of the two other peaks, only moderate degradation of the speckle reduction will be observed, which may be traded off against the potential increase in efficiency, when such a trade-off is desirable.

Figure 7:
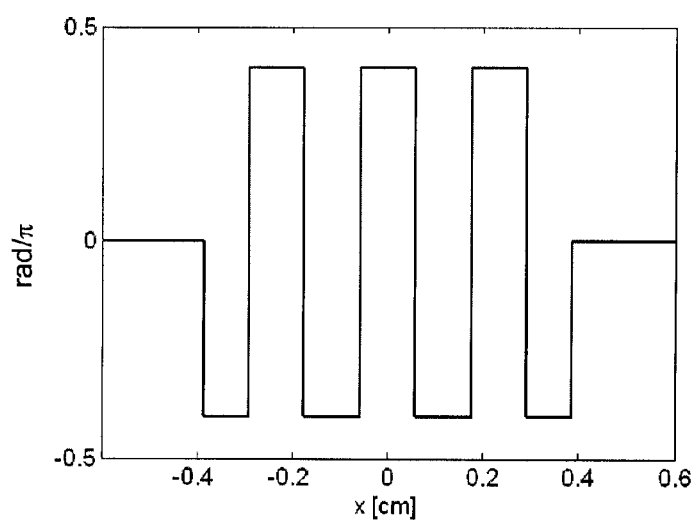
FIG. 7 is a graph of a rectangular phase modulation function according to one or more embodiments shown and described herein.
Figure 8:
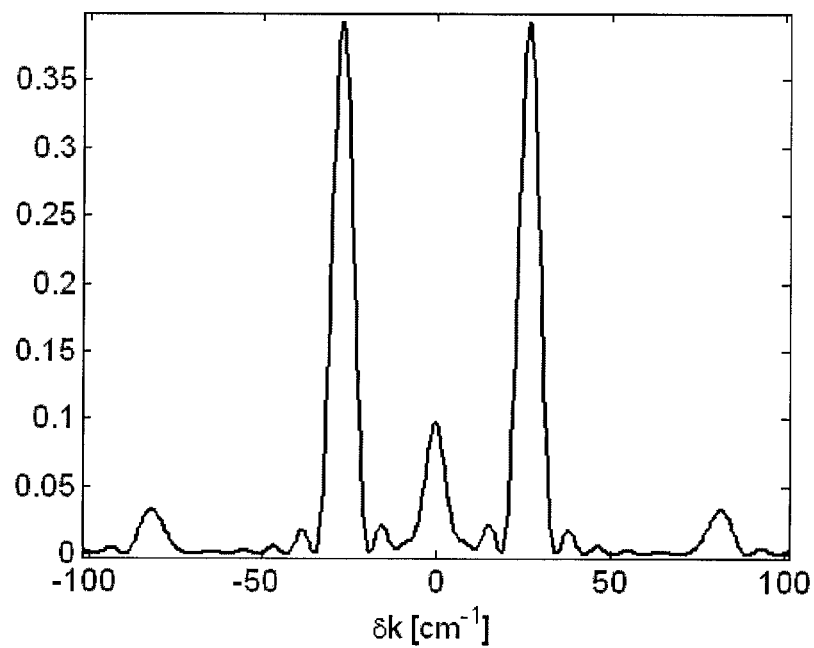
FIG. 8 is a graph of a spectral response in wave-vector space of a wavelength conversion device having a phase-modulated periodicity defined in part by the rectangular phase modulation function illustrated in FIG. 7 according to one or more embodiments shown and described herein.

In another embodiment, the discrete PMF 150 may control the ratios of the magnitudes of the multiple phase-matching peaks via the depth of discrete phase modulation, rather than the duty cycle. The PMF may consists of a rectangular waveform with amplitude $\Phi_0^{PM}$. The phase imparted on the phase-matching by the PMF is given by $$\Phi_{PM} = \Phi_0^{PM} \text{sign}\left(\cos\left(\frac{2\pi x}{\Lambda_{PM}}\right) + \varphi_0\right), \quad \text{Eq. (15),}$$

where $\phi_0$ is a parameter allowing for a constant phase shift of the PMF waveform with respect to the mid-point along the QPM structure, if desired. As an example, the PMF for the case $L=3.3\Lambda_{PM}$ with peak ratio of 4:1:4 illustrated in FIG. 7, and the spectral response is shown on FIG. 8. Since the sign function takes on the values +1 when its argument is positive, −1 when its argument is negative, and 0 when its argument is 0, the phase defined by the PMF essentially jumps periodically between the values $\Phi_{PM}^0$ and $-\Phi_{PM}^0$. The depth of phase modulation (DPM) $\in$ equals twice the amplitude of phase modulation:

$$\in = 2\Phi_{PM}^0, \quad \text{Eq. (16).}$$

Using a PMF defined by Eq. (15) with $\phi_0=0$ and $\Lambda_{PM}=0.2335$ cm on a wavelength conversion device with phase-matching length $L=0.7706$ cm, by varying the amplitude $\Phi_0^{PM}$ from $0.316\pi$ to $0.403\pi$, the three main peaks in the phase-modulated QPM spectral response range in ratio from 1:1:1 to 4:1:4. In addition, the peak ratio is 4:1.75:4 when $\Phi_0^{PM}=0.372\pi$, and 2:1:2 when $\Phi_0^{PM}=0.364\pi$. These latter QPM-peak ratios, as explained later, may be of interest for the case of multi-mode spectral peaks of the pump. If applied to a PPMgLN waveguide, the above PMFs would provide QPM for frequency mixing of pump spectral peaks centered around 1061 nm and spaced by about 1.9 nm in wavelength. For longer QPM structures (for example, 0.9948 cm) and the same peak ratios, the respective depths of phase modulation are essentially the same (to within $0.002\pi$). In addition, the effect of waveform truncation due to crystal length not equal to an even number or integer number of PMF periods has a minor effect on the necessary depth of phase modulation for a certain required magnitude ratio of the phase-matching spectral peaks. Some examples of discrete rectangular PMFs ($\Lambda_{PM}=0.2335$ cm, $\phi_0=0$) spanning the range of practical importance are summarized in Table 1.

TABLE 1

Rectangular-wave-PMF parameters and magnitudes of the peaks in the phase-matching spectral response. $M_{SHG}$ and $M_{SFG}$ the magnitudes of the peaks in the phase-matching response assigned to phase-match second-harmonic generation and sum-frequency generation, normalized to the magnitude of single-mode SHG response of a truly periodic phase-matching structure of the same length.

| | Phase-matching length | | | | | | | |
|---|---|---|---|---|---|---|---|---|
| | $3.3\,\Lambda_{PM}$ | $3.3\,\Lambda_{PM}$ | $3.3\,\Lambda_{PM}$ | $3.3\,\Lambda_{PM}$ | $4.28\,\Lambda_{PM}$ | $4.28\,\Lambda_{PM}$ | $4.28\,\Lambda_{PM}$ | $4.28\,\Lambda_{PM}$ |
| Phase amplitude $\Phi_0^{PM}$ | $0.316\pi$ | $0.364\pi$ | $0.372\pi$ | $0.403\pi$ | $0.316\pi$ | $0.363\pi$ | $0.372\pi$ | $0.401\pi$ |
| $M_{SHG}$ | 0.3 | 0.358 | 0.366 | 0.392 | 0.3 | 0.352 | 0.3605 | 0.386 |
| $M_{SFG}$ | 0.3 | 0.179 | 0.16 | 0.0976 | 0.3 | 0.177 | 0.1562 | 0.097 |
| Approximate target ratio $M_{SHG}:M_{SFG}:M_{SHG}$ | 1:1:1 | 2:1:2 | 4:1.75:4 | 4:1:4 | 1:1:1 | 2:1:2 | 4:1.75:4 | 4:1:4 |

Figure 9:
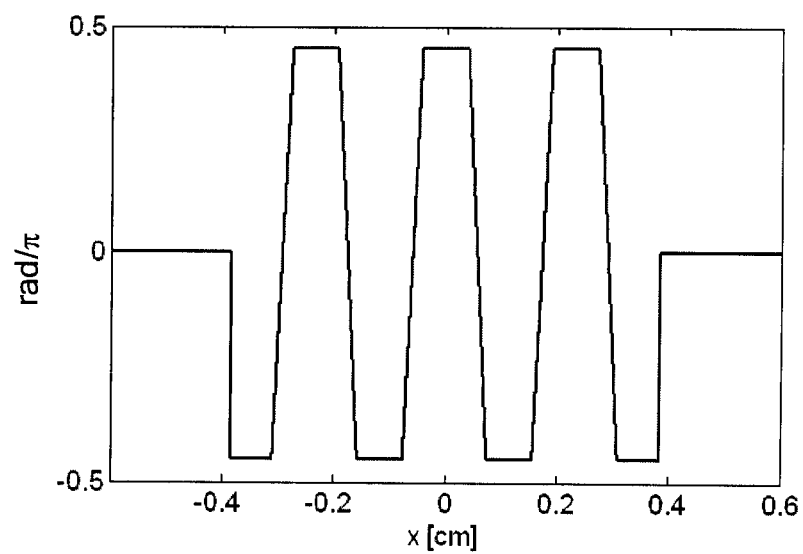
FIG. 9 is a graph of a trapezoidal phase modulation function according to one or more embodiments shown and described herein.
Figure 10:
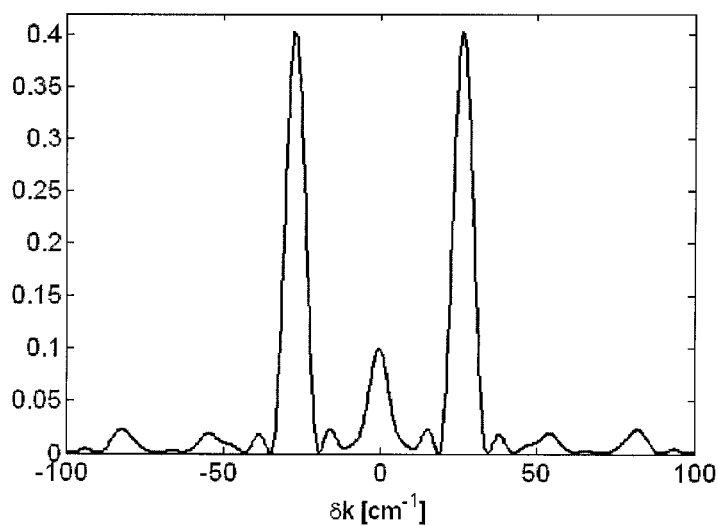
FIG. 10 is a graph of a spectral response in wave-vector space of a wavelength conversion device having a phase-modulated periodicity defined in part by the trapezoidal phase modulation function illustrated in FIG. 9 according to one or more embodiments shown and described herein.

In an another alternative embodiment, the PMF 150 is a trapezoidal function of x. The function is periodic with period $\Lambda_{PM}$. FIG. 9 illustrates an example of a trapezoidal PMF for the case of $L=3.3\Lambda_{PM}$ with peak ratio of 4:1:4, and the corresponding spectral response is illustrated in FIG. 10. In each half-period, rather than taking on a single constant value, the imparted phase follows a ramp section and a plateau section. In the case of a symmetric trapezoidal PMF, the latter may be defined by the phase amplitude $\Phi^0_{PM}$, the period $\Lambda_{PM}$, the phase shift $\phi_0$, and a plateau duty cycle (PDC). The PDC equals the length of a plateau section as a fraction of the half-period. The length $L_{ramp}$ of the ramp section is the rest of the half-period, and the ramp rate is $1/L_{ramp}$, multiplied by the amplitude $\Phi^0_{PM}$. Because of the additional free parameter (ramp), certain required phase-matching peak ratios can be obtained by different combinations of parameters, and thus different trapezoidal PMF waveforms. The trapezoidal PMF hence may provide a flexible method to modulate the phase-matching to obtain optimum performance in terms of speckle reduction and conversion efficiency. Examples of PMF parameter sets and the corresponding excellent normalized magnitudes of the phase-matching peaks are included in Table 2. Some specific examples of symmetric trapezoidal PMFs ($\Lambda_{PM}=0.2335$ cm, $\phi_0=0$) spanning the range of spectral responses of practical importance are summarized in Table 2.

TABLE 2

Trapezoidal-wave-PMF parameters and magnitudes of the peaks in the phase-matching spectral response. $M_{SHG}$ and $M_{SFG}$ the magnitudes of the peaks in the phase-matching response assigned to phase-match second-harmonic generation and sum-frequency generation, normalized to the magnitude of single-mode SHG response of a truly periodic phase-matching structure of the same length.

| | | | | |
|---|---|---|---|---|
| Phase-matching length | $3.3\,\Lambda_{PM}$ | $3.3\,\Lambda_{PM}$ | $3.3\,\Lambda_{PM}$ | $3.3\,\Lambda_{PM}$ |
| Phase amplitude $\Phi_0^{PM}$ | $0.377\pi$ | $0.4\pi$ | $0.415\pi$ | $0.45\pi$ |
| PDC | 0.51 | 0.715 | 0.69 | 0.70 |
| $M_{SHG}$ | 0.322 | 0.372 | 0.381 | 0.4025 |
| $M_{SFG}$ | 0.322 | 0.188 | 0.166 | 0.1007 |
| Approximate target ratio $M_{SHG}:M_{SFG}:M_{SHG}$ | 1:1:1 | 2:1:2 | 4:1.75:4 | 4:1:4 |

The linear ramp of the imparted phase represents a constantly increasing or decreasing phase shift along the propagation direction. It can also be seen from a different point of view as a change in the local period of the QPM structure, in the case of quasi phase matching. Thus, the symmetric continuous trapezoidal phase modulation function can be seen to represent a structure containing three different QPM periods. The period of the unperturbed design is observed in the regions along the device length where the PMF is represented by a plateau of the imparted phase. The period is fixed to one of two values, one smaller, and one larger than the carrier periodicity, in the regions where the PMF is represented by ramps.

Figure 11:
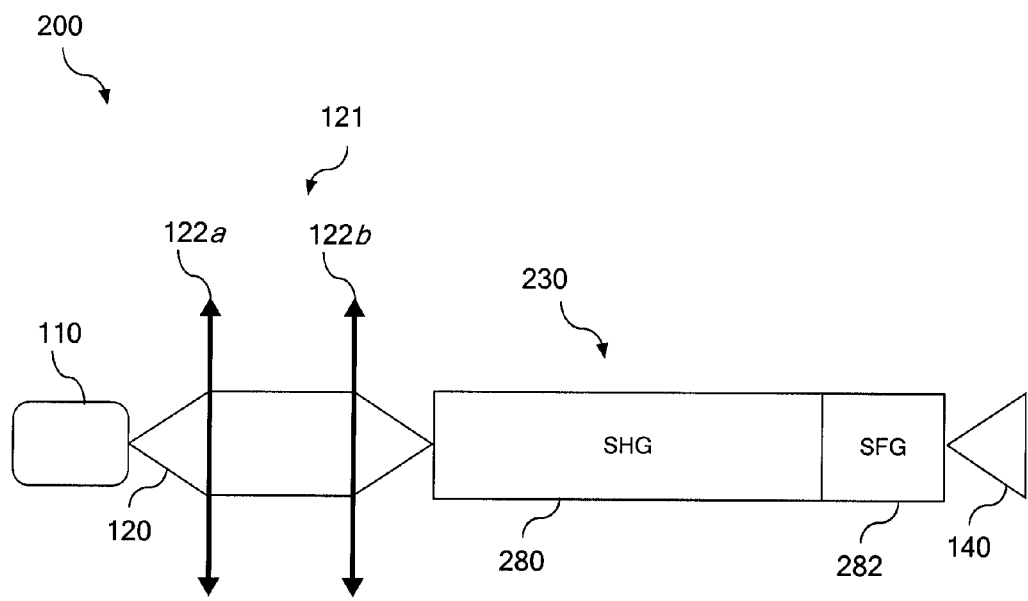
FIG. 11 is a schematic illustration of an optical system having a two-section wavelength conversion device according to one or more embodiments shown and described herein.

For relatively smooth projection surfaces, it may be desirable to have larger spectral separation of the visible frequency-converted spectral peaks than can be tolerated by the above described schemes producing equally separated phase matching peaks. In that case $\Delta k_{SFG}$ would be shifted substantially from the center of the middle phase matching peak of a QPM superstructure with three equally-spaced quasi-phase matching peaks, where the two outer peaks are aligned to match the wave-vector mismatch for the two second harmonic generation processes. In that case, measures should be taken to ensure that all three frequency conversion processes are properly phase-matched. One way to achieve this is to use a wavelength conversion device having a shorter crystal three equally separated quasi-phase matching peaks as described above. The need for larger wavelength separation of the quasi-phase matching peaks leads to a reduction of the period of the discrete PMF, while at the same time the width of each of the quasi-phase matching peaks will increase as the crystal length is decreased.

Where speckle reduction on screens with finer roughness is desired, a QPM structure with wider spacing of the quasi-phase matching peaks may be necessary. In this case, the central quasi-phase matching peak may need to be slightly shifted to align the peaks with the non-uniformly spaced $\Delta k$-vectors for second harmonic generation and sum-frequency generation processes. FIG. 11 illustrates an embodiment in which a wavelength conversion device 230 comprises a first poled lithium niobate crystal section 280 and a second poled lithium niobate crystal section 282. The wavelength conversion device 230 of this embodiment combines a QPM structure (first crystal section 280) having a phase modulated periodicity in accordance with a discrete PMF as described above to produce two quasi-phase matching peaks to be used for second harmonic generation with a shorter uniform QPM structure (second crystal section 282) having a slightly different basic QPM period to produce a lower quasi-phase matching peak to be used for sum-frequency generation. The period of the shorter QPM structure is such that the sum-frequency generation quasi-phase matching peak may be properly shifted to compensate for the mismatch $\Delta k_{SFG}$. In addition, the spectral separation of the quasi-phase matching peaks should be substantially larger than the width of each quasi-phase matching peak to avoid interference between the quasi-phase matching peaks that would lead to their distortion. In a related embodiment, the order of the sections 280 and 282 may be reversed along the light path with similar resulting performance. In cases where pump depletion is of concern, the optimum ratio of lengths of sections 280 and 282 may change slightly depending on the order of their appearance along the light path.

The first crystal section 280 that produces the outer second harmonic generation QPM peaks may be based on sign-reversal (π-phase-shifts) described above or other techniques for efficient splitting of the quasi-phase matching peak into two quasi-phase matching peaks. For example, if the first section 280 of the wavelength conversion device 230 comprises a phase modulated periodicity by sign-reversal with a length $L_1$, and the outer quasi-phase matching peaks corresponding to the second harmonic generation processes need to be four times higher than the central quasi-phase matching peak corresponding to the sum-frequency generation process, then the length of the second crystal section $L_2$ of the undisturbed (i.e., truly periodic) central quasi-phase matching peak is related to $L_1$ by:

$$4(L_2)^2 = 0.41*(L_1)^2, \qquad \text{Eq. (17)},$$

taking into account that the quasi-phase matching peaks of the first crystal section are reduced by a factor of approximately 0.41 compared to a crystal having a uniform QPM grating. The factor of 0.41 is approximate as the actual value depends on how the PMF is truncated at the ends of the phase-matching structure, which may lead to a variation of several percent in cases where only a few periods of the phase matching function fit within the length of the phase-matching structure. From equation 17 it follows that $L_2=0.32*L_1$, and the total wavelength conversion device length according to this embodiment is $L=L_1+L_2=1.32*L_1$. As described above, the length $L_1$ of the phase-modulated section may be chosen approximately equal to $(m+0.3)\Lambda_{PM}$ with integer m, to provide favorable truncation of the PMF to obtain normalized magnitude of the two spectral peaks somewhat better than 0.41. Then the ratio of the lengths $L_1$ and $L_2$ may need to be adjusted slightly to rebalance the optical power of the three output peaks. The short QPM section assigned to sum-frequency generation may also precede along the light path the phase-modulated section assigned to second harmonic generation.

As an example and not a limitation, a wavelength conversion device consisting of a 6.05 mm long first poled lithium niobate crystal or waveguide section having a QPM grating with a discrete phase modulation function having a period of 1 mm and a duty cycle of 50% applied to a fundamental QPM period $\Lambda_1$ would produce two quasi-phase matching peaks separated by approximately 4 nm in fundamental wavelength. The full-width at half-maximum (FWHM) of the spectral peaks would be $$\frac{1.772\pi}{0.605 \text{ cm}} = 9.2 \text{ cm}^{-1}$$

in Δk space or 0.3 nm in fundamental wavelength. A second poled lithium niobate crystal section with a length $L_2=1.95$ mm and QPM period $\Lambda_2$ appropriately chosen to compensate $\Delta k_{SFG}$ will have a spectral width of $$\frac{1.772\pi}{0.195 \text{ cm}} = 28.5 \text{ cm}^{-1}$$

in Δk space or 1 nm in fundamental wavelength. It is noted that the two-section wavelength conversion device may not be fully optimized because the middle quasi-phase matching may be substantially wider than the outer quasi-phase matching peaks, which is unnecessary for speckle reduction.

In the case where each of the two fundamental spectral peaks consists of multiple longitudinal modes of the semiconductor laser, the optimum ratio of magnitudes of spectral response of the phase-matching peaks changes. The three frequency up-converted spectral peaks on the output of the wavelength conversion device will consist of multiple spectral lines produced by frequency doubling or sum-frequency mixing of narrow lines corresponding to the various longitudinal pump laser modes that constitute the two fundamental spectral peaks.

For example, let each of the two fundamental spectral peaks of the pump beam be comprised of M longitudinal modes. Let the efficiency of frequency doubling of a single longitudinal mode within a spectral peak with normalized magnitude 1 be $\eta_0$, and each of the three phase-matching or QPM spectral peaks have a normalized magnitude of 1. Assuming that the bandwidth of the phase-matching or QPM spectral peaks of the wavelength conversion device does not limit the efficiency of frequency mixing between the various modes, the following relations hold:

1) For the sum-frequency generation mixing efficiency between frequency components (modes) belonging to different spectral peaks, $\eta_{SFG}=4\eta_0$; and 2) For the total frequency up-conversion of the components (modes) of one of the fundamental spectral peaks produced by only the one corresponding SHG phase-matching or QPM spectral peak of the wavelength conversion device, excluding the mixing with modes from the other fundamental spectral peak: $\eta_{SHG}=(2-1/M)\eta_0$. This relation is derived by taking into account the contributions of frequency doubling of each pump longitudinal mode with a relative weight of 1 and sum-frequency mixing of different longitudinal modes (contained within the same fundamental spectral peak) with a relative weight of 4.

Maximum reduction of speckle contrast will again be observed when the optical power of the frequency-converted output is evenly distributed among the three frequency-converted spectral peaks. This may be obtained by adjusting the normalized peak efficiency of the three quasi-phase matching peaks as follows: $\eta_{SHG1}:\eta_{SFG}:\eta_{SHG2}=4:(2-1/M):4$. When M is >>1, the optimum ratio becomes 2:1:2. It is noted that for the same wavelength conversion device length, compared to the case where each of the fundamental spectral peaks contains a single mode, the multi-mode embodiment may actually result in higher overall conversion efficiency. This is because the overall conversion efficiencies of the multimode second harmonic generation quasi-phase matching peaks are increased by up to a factor of two. To obtain maximum reduction of speckle contrast, the efficiency of the center sum-frequency quasi-phase matching peak should be increased by approximately the same factor, thereby boosting overall efficiency. This boost in efficiency may be reduced if the spectral widths of the fundamental spectral peaks are comparable or wider than the acceptance bandwidth of the quasi-phase matching peaks of the quasi-phase matching response.

Figure 12:
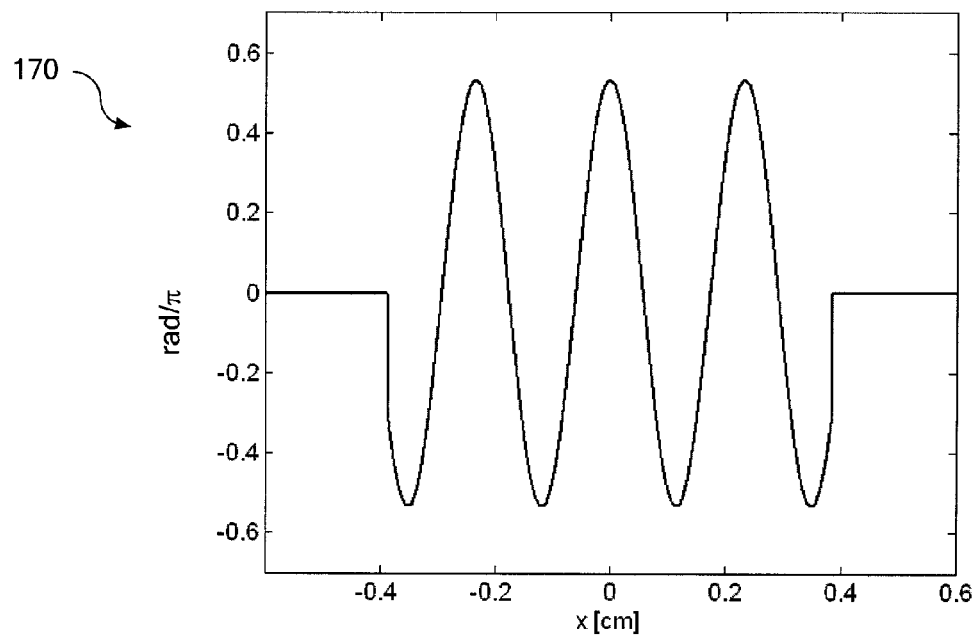
FIG. 12 is a graph of a continuous sinusoidal phase-modulating function according to one or more embodiments shown and described herein.

FIGS. 12-14B illustrate another embodiment of phase modulation that may be utilized to produce the three frequency-converted spectral peaks of the wavelength conversion device in a multi-mode embodiment. The PMF illustrated in FIG. 12 is a sinusoidal function 170 that, when applied to the carrier periodicity Λ, provides for a plurality of domains having a phase-modulated periodicity. It is to be understood that although the sinusoidal function 170 is described in the context of fundamental spectral peaks having multiple longitudinal modes, such a sinusoidal function may also be utilized in embodiments wherein the fundamental spectral peaks have a single longitudinal mode. The depth of phase modulation may be adjusted (i.e., increased slightly) to provide a peak ratio appropriate for optimum speckle reduction with single-mode fundamental spectral peaks.

Figure 14A:
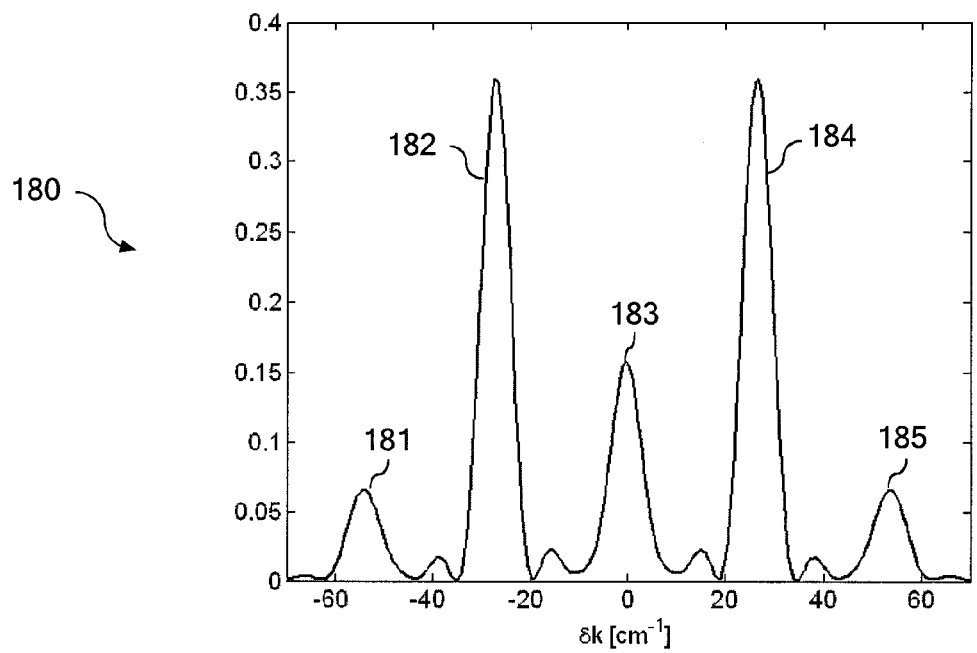
FIG. 14A is a graph of a spectral response in wave-vector space of a wavelength conversion device having a phase-modulated periodicity defined in part by the sinusoidal function illustrated in FIG. 12 according to one or more embodiments shown and described herein.

Rather than discretely modulating the phase of the plurality of domains as described above with respect to FIGS. 4-6, the sinusoidal function has the effect of continuously shifting the position of the ferroelectric domains with respect to normal periodic positions defined by the phase matching period $\Lambda$. As described above with respect to the discrete PMFs, the phase-modulated periodicity, when applied to the nonlinear optical material in the form of quasi-periodic poling domains, has the effect of splitting a single quasi-phase matching peak centered at $\delta k$ into three quasi-phase matching peaks, producing side bands (182, 184) equally spaced adjacent to the center quasi-phase matching peak 183 (FIG. 14A). The sinusoidal PMF 170 has a very large period compared with the phase matching period $\Lambda$ and therefore a very small k-vector. Therefore, the sinusoidal function introduces a very small perturbation on the relative positions of the poling domains.

Figure 13:
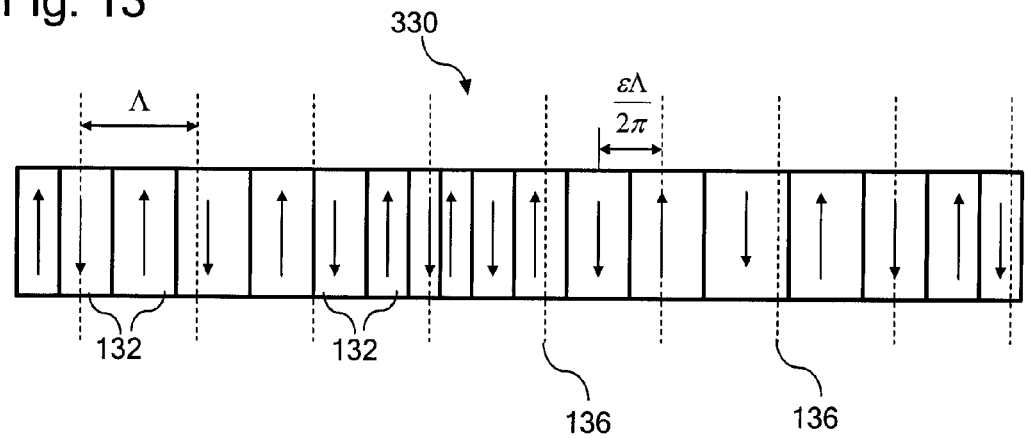
FIG. 13 is a schematic diagram of a wavelength conversion device having a phase-modulated periodicity defined in part by the sinusoidal function illustrated in FIG. 12 according to one or more embodiments shown and described herein.

Referring specifically to FIGS. 12 and 13, one embodiment of a PMF and resulting plurality of poling domains having a phase-modulated periodicity is illustrated. FIG. 12 illustrates a sinusoidal function 170 that, when applied to the phase matching period $\Lambda$, continuously shifts the positions of the poling domains by $\Delta x(x_l)$, which may be expressed by:

$$\Delta x(x_l) = \frac{\Lambda \Phi_0^{PM}}{2\pi} \cos(k_x x_l + \phi_0) = \frac{\varepsilon \Lambda}{4\pi} \cos(k_x x_l + \phi_0), \quad \text{Eq. (18),}$$

where $\varepsilon$ is the depth of phase modulation equal to twice the phase modulation amplitude $\Phi_0^{PM}$. The depth of modulation $\varepsilon$ affects the relative magnitude of the resulting quasi-phase matching peaks 182, 183 and 184.

The quasi-periodically poled wavelength conversion device 330 illustrated and characterized by FIGS. 12-14B is a 7.706-mm long poled lithium niobate waveguide that is pumped by a pump beam having two fundamental spectral peaks 125, 127 about 0.25 nm wide and centered at 1060.5 and 1062.4, respectively. Each fundamental spectral peak may comprise three to five modes. Therefore, the optimum spectral response ratio would be between 4:1.67:4 and 4:1.8:4. To achieve a wavelength conversion device 130 having a spectral response ratio of 4:1.75:4, the depth of phase modulation $\varepsilon$ provided by the sinusoidal function 170 is about $1.066\pi$ and the period of the sinusoidal function 170 is about 2.335 mm The wavelength conversion device 130 has approximately 3.3 periods of the sinusoidal phase modulation function 170 applied to the carrier periodicity. The length of the wavelength conversion device 330 may be determined by an optimum truncation of the phase-modulation provided by the sinusoidal function 170. Optimum truncation of the phase-modulation may be obtained when the relationship between the length of the phase-modulated periodicity of the poling domains and the period of the sinusoidal function 170 is:

$$L = (m+0.3)*\Lambda_S, \quad \text{Eq. (19),}$$

where $\Lambda_S$ is the period of the sinusoidal function 170 and m=1, 2, 3 and so on. The range of appropriate values is between about m+0.2 to about m+0.45, with an optimum centered around m+0.3. When the length of the wavelength conversion device 330 is chosen among these ranges and the sinusoidal function is applied symmetrically with respect to the center of the wavelength conversion device, most of the efficiency*bandwidth area is preserved in the three desired quasi-phase matching peaks 182, 183 and 184 and less goes to the unused quasi-phase matching peaks (e.g., 181, 185) outside of the central wavelength region of interest.

When the length of the wavelength conversion device is chosen in this manner, the truncation on the two edges of the wavelength conversion device occurs right after a peak or trough of the sinusoidal function and not on or right after a steep slope. The peaks and troughs of the cosine of the phase are regions where the period of poling has a value near the center of the range of periods covered by the phase-modulated QPM-grating. The regions where the phase changes fast on sloped parts of the sinusoidal function are regions where the local period is substantially shorter or substantially longer than the average period. Such periods phase match second harmonic generation for wavelengths that are away from the central wavelength, thereby spreading the efficiency outside of the central region of interest.

FIG. 13 schematically illustrates a portion of a wavelength conversion device 330. The wavelength conversion device 330 comprises a plurality of poling domains 132 that alternate in crystallographic orientation as indicated by the up ↑ and down ↓, arrows. The respective positions of the poling domains 132 are longitudinally shifted relative to normal periodic positions defined by the carrier periodicity (depicted by dashed vertical lines 136). The shift is continuous in accordance with the sinusoidal PMF. For example, the domain 139 has been shifted in accordance with a peak of the sinusoidal function 170 and therefore is shifted by a maximum value with respect to its normal periodic position, which is characterized by the amplitude of modulation $\Phi_0^{PM}$. As shown in FIG. 13, the relative positions of the inverted domains 132 are continuously shifted longitudinally.

Figure 14B:
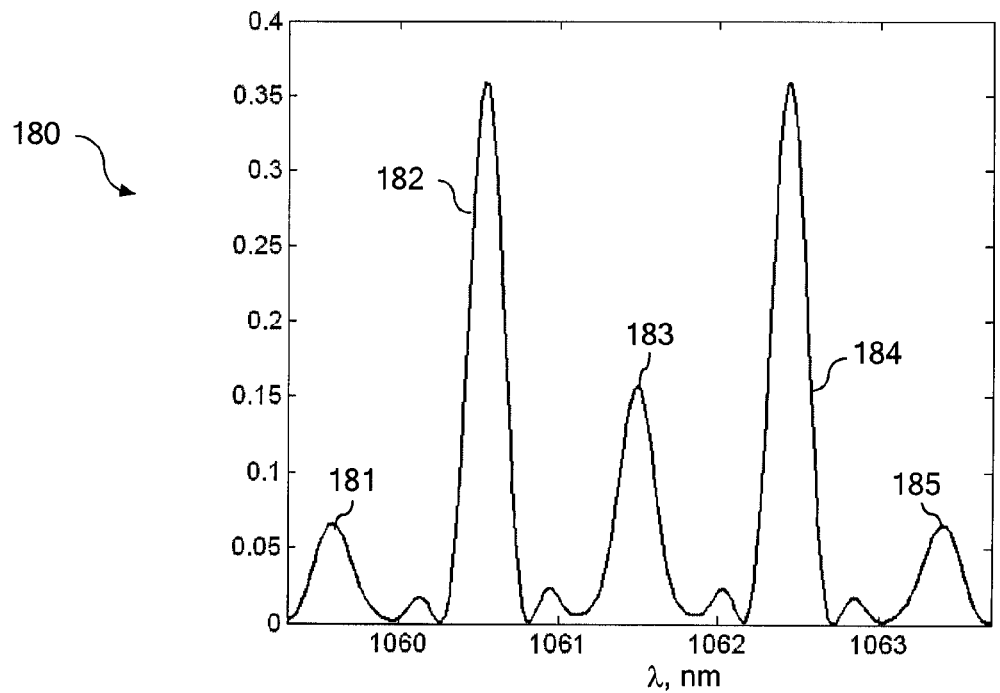
FIG. 14B is a graph of a spectral response in wavelength space of a wavelength conversion device having a phase-modulated periodicity defined in part by the sinusoidal function illustrated in FIG. 12 according to one or more embodiments shown and described herein.

As illustrated in FIGS. 14A and 14B, the response ratio 180 of the three quasi-phase matching peaks 182, 183 and 184 is approximately 4:1.75:4. FIG. 14A illustrates the quasi-phase matching peaks 182, 183 and 184 in $\delta k$ space while FIG. 14B illustrates the same in wavelength space for the case of a periodically-poled MgO-doped lithium niobate waveguide. With two multimode fundamental peaks 125, 127 (FIG. 3A) of the pump beam emitted by a semiconductor laser, the overall conversion efficiency would be almost twice as high as the efficiency of a pump beam having single-mode fundamental spectral peaks using the structure described in FIGS. 4-6. For the case of FIG. 14B (as compared with Eq. (5)), the conversion efficiency may be described by:

$$P_{out} = 0.365*2*\eta_0(P/2)^2 + 0.160*4*\eta_0(P/2)^2 + 0.365*2*\eta_0(P/2)^2 = 0.525\eta_0 P^2, \quad \text{Eq. (20).}$$

Generally, if each fundamental spectral peak contains N modes, the increase in efficiency between using multimode fundamental peaks and single-mode fundamental peaks will be close to (2−1/N). The improvement calculated from Eq. 20 is higher because of the better optimization of the tuning curve in comparison with the sign-flip structure described above in association with the case of single-mode pump spectral peaks. In some cases, the efficiency increase may be smaller due to the effect of limited QPM bandwidth of each of the quasi-phase matching peaks, e.g., when the spectral bandwidth of the optical pulses is comparable or larger than the QPM acceptance bandwidth of the quasi-phase matching peaks. Also, the experimental ratio of the quasi-phase matching peak magnitudes may vary somewhat compared with the theoretical ratio due to imperfect device fabrication. Such imperfections may include, but are not limited to, low-to-moderate poling fidelity and some waveguide non-uniformity along the length in the case of wavelength conversion devices based on waveguides. Small variations of the quasi-phase matching peak ratio will typically have a small effect on the speckle reduction properties.

Another consideration when using a pump beam having multimode fundamental spectral peaks to pump the wavelength conversion device is that the overall spectral bandwidth of each of the fundamental peaks may be comparable to the QPM bandwidth (in terms of pump wavelength) of the corresponding quasi-phase matching peaks (for SHG or for SFG). This may limit the conversion efficiency or impose a minor change in the optimum ratio of the quasi-phase matching peaks when the quasi-phase matching peaks partially filter the fundamental optical frequencies. For example, if each of the fundamental spectral peaks has a spectral linewidth of 0.3 nm in wavelength space, then a quasi-phase matching FWHM bandwidth of any of the quasi-phase matching peaks that is smaller than or comparable to 0.3 nm may substantially alter the conversion efficiency provided by that QPM peak. To stay within the limits of the preceding multimode analysis, the wavelength conversion device should have phase matching peaks that are at least as broad as the spectral bandwidth of the multimode fundamental spectral peaks in wavelength space. This may impose limits on the length of the wavelength conversion device or on the complexity of the superstructure used to produce the multiple quasi-phase matching peaks. Narrower quasi-phase matching peaks result in a minor change in the optimum peak ratio for speckle reduction but exhibit a lower overall up-conversion efficiency compared to adequately broad quasi-phase matching peaks of the same maximum response magnitude. On the other hand, when narrower quasi-phase matching peaks are due to a longer QPM wavelength conversion device, the maximum magnitude of these quasi-phase matching peaks is higher, and will in many cases increase overall efficiency.

A restriction in the length of the wavelength conversion device may lead to a limitation on the overall conversion efficiency. For example, if each fundamental spectral peak is 0.3 nm wide, each quasi-phase matching peak should be at least 0.3-nm wide as well, leading to a total device length no longer than 6 mm, unless additional measures are taken to design a more sophisticated superstructure that allows for spectral broadening in addition to spectral splitting. The two-section wavelength conversion device with a first crystal section 280 having two quasi-phase matching peaks achieved by sign-flipping of particular poling domains (for example, by application of the discrete sign-flipping PMF 150) followed by a shorter uniformly poled second crystal section 282 with one quasi-phase matching peak shifted to match $\Delta k_{SFG}$ described above and illustrated in FIG. 11 may also be utilized in this case. The need to increase the central peak magnitude leads to an increase in its relative portion of the total length and a decrease in its bandwidth. Because the bandwidth of the center quasi-phase matching peak may be unnecessarily large in comparison with the outer quasi-phase matching peaks, this embodiment may reduce speckle and efficiently utilize bandwidth. Assuming adequate bandwidth, the length ratio for highly-multimode pump spectral peaks may be determined by:

$$2(L_2)^2 = 0.41(L_1)^2 : L_2 = 0.45 L_1, \quad \text{Eq. (21).}$$

As an example and not a limitation, a wavelength conversion device with a total length of 8 mm will have a phase-flipped first crystal section 280 with length $L_1$ of about 5.52 mm and a uniformly poled second crystal section 282 for the center sum-frequency quasi-phase matching peak with a length $L_2$ of about 2.48 mm The QPM bandwidth of the two second harmonic generation quasi-phase matching peaks in wavelength space will be about 0.36 nm. The QPM bandwidth of the sum-frequency generation quasi-phase matching peak will be about 0.83 nm. If the second harmonic quasi-phase matching peaks reduce conversion efficiency by their inadequate bandwidth, then the length of the additional QPM section producing the sum-frequency generation quasi-phase matching peak should be shortened slightly to force a corresponding reduction in efficiency for the sum-frequency generation quasi-phase matching peak to minimize the speckle contrast.

The limitation described above related to the shift of $\Delta k_{SFG}$ with respect to the average of $\Delta k_{SHG1}$ and $\Delta k_{SFH2}$ are also applicable in multimode applications. Therefore, wavelength conversion devices having a poling structure with limited length for adequate bandwidth, or wavelength conversion devices having a poling structure with a shifted central quasi-phase matching peak may be used when speckle reduction requires larger frequency spacing of the quasi-phase matching peaks. For optimum speckle reduction, the ratio of the output quasi-phase matching peaks with non-uniform wavelength spacing should still be selected to match approximately the ratio 4:(2−1/N):4.

Another consideration that may need to be taken into account when designing the poling structure for the wavelength conversion device is that individual modes emitted by the DBR laser might not have exactly the same power. Therefore, the QPM design of the wavelength conversion device for multimode application may need to be slightly adjusted to equalize the intensities of the three output spectral peaks.

Another consideration is a case where the two pump spectral peaks may differ somewhat in optical power. In that case, the symmetry of the QPM peak magnitudes with respect to the location of the central peak may be broken to compensate for the unequal power in the pump spectral peaks. This can be achieved by applying an appropriate non-zero phase shift $\phi_0$ in any of the described periodic PMF's, or by adding a quadratic chirp to the phase-modulating function. Alternatively, a non-uniform waveguide design may be utilized to provide the chirp through varying the linear waveguide properties. Shifting the PMF with respect the center of the QPM structure, results in a phase shift that would render the side quasi-phase matching peaks utilized for SHG unequal in magnitude as needed.

It is noted that the embodiments described herein are not limited to a semiconductor laser emitting two fundamental spectral peaks and a wavelength conversion device that emits an output beam having three frequency-converted spectral peaks. For example, the methods described above may be used to design a frequency-converted optical system emitting five or six nearly equal intensity frequency-converted spectral peaks separated by >0.5 nm, leading to a speckle reduction of $\sqrt{5}$ or $\sqrt{6}$. In this case, the semiconductor laser emits three equally-spaced or unequally-spaced fundamental spectral peaks, and the wavelength conversion device is designed to have at least five or six (quasi-)phase matching peaks, three for second harmonic generation and two or three for sum-frequency generation. When the fundamental spectral peaks are uniformly spaced in wavelength, one of the three SFG wavelengths will coincide with the "middle" SHG wavelength. Lasers emitting seven, eight, nine, or more frequency-converted spectral peaks may be designed, in each case the laser emitting N equally spaced fundamental spectral peaks and the wavelength conversion device having 2N−1 or more quasi-phase matching peaks: N for SHG or SHG+SFG, and (N−1) exclusively for SFG processes. For non-uniformly spaced N fundamental spectral peaks, a full set of up to (N+1)N/2 output spectral peaks may be produced, N for SHG and (N−1)N/2 for SFG. The conversion efficiency gain due to pulsed operation (peak power higher than average power) can be used to compensate for the lower conversion efficiency of each of the (quasi-)phase matching peaks of the multi-peak phase-matching design compared to the single peak of a unperturbed phase-matching structure of the same length.

In other embodiments, optical intensity in the nonlinear device may be increased by intra-cavity wavelength conversion, where the nonlinear optical medium is inserted inside the resonator of the pump laser, or by resonating the fundamental or the up-converted optical signal in a separate cavity containing the nonlinear medium. In addition, the conversion efficiency may be increased by double-pass wavelength conversion in the nonlinear medium, where frequency up-converted signal is generated when pump light travels in the nonlinear medium both in the direction away from the pump gain medium, and in the opposite direction toward the pump gain medium.

It is to be understood that the preceding detailed description is intended to provide an overview or framework for understanding the nature and character of the subject matter as it is claimed. It will be apparent to those skilled in the art that various modifications and variations can be made to the embodiments described herein without departing from the spirit and scope of the invention. Thus, it is intended that the present invention cover the modifications and variations of this invention provided they come within the scope of the appended claims and their equivalents.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the terms "substantially," "approximately" and "about" are utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernible amount.

What is claimed is:

1. An optical system comprising an optical source and a wavelength conversion device, wherein:
   the optical source comprises a laser configured to emit a pump beam having at least two fundamental spectral peaks; and
   the wavelength conversion device comprises a single non-linear optical medium configured to phase match the frequency doubling of at least two of the fundamental spectral peaks and the sum-frequency mixing of each of at least two of the fundamental spectral peaks such that an output beam comprising at least three frequency-converted spectral peaks having approximately equal power is emitted from an output facet of the wavelength conversion device when the pump beam of the optical source is incident on an input facet of the wavelength conversion device.

2. The optical system of claim 1 wherein the wavelength conversion device is located within an optical cavity of the laser.

3. The optical system of claim 1 wherein the laser is operated in a pulsed mode such that the two fundamental spectral peaks have substantially equal power.

4. The optical system of claim 1 wherein the number of frequency-converted spectral peaks of the output beam is greater than the number of fundamental spectral peaks of the pump beam.

5. The optical system as claimed in claim 1 wherein:
   the laser is configured to emit a pump beam having N fundamental spectral peaks; and
   the output beam having between 2N−1 and (N+1)N/2 frequency-converted spectral peaks having approximately equal power is emitted from the output facet of the wavelength conversion device when the pump beam of the optical source is incident on the input facet of the wavelength conversion device.

6. The optical system as claimed in claim 1 wherein:
   the wavelength conversion device is characterized by a first, second and third phase matching peak;
   the first and third phase matching peaks are for second harmonic generation and the second phase matching peak is for sum-frequency generation; and
   the first, second and third phase matching peaks have a response ratio that produces the three frequency-converted spectral peaks having approximately equal power when the pump beam is incident on the input facet of the wavelength conversion device.

7. The optical system as claimed in claim 6 wherein the phase matching peaks of the wavelength conversion device corresponding to the first and third frequency-converted spectral peaks have a magnitude that is greater than a magnitude of the phase matching peak of the wavelength conversion device corresponding to the second frequency-converted spectral peak.

8. The optical system as claimed in claim 6 wherein:
   each of the two fundamental spectral peaks comprises approximately M longitudinal laser modes; and
   the response ratio between the first phase matching peak, the second phase matching peak, and the third phase matching peak is approximately $4:(2-1/M):4$.

9. The optical system as claimed in claim 1 wherein the three frequency-converted spectral peaks are separated by more than about 0.25 nanometers in wavelength.

10. The optical system as claimed in claim 1 wherein:
    the non-linear optical medium is quasi-periodically poled and comprises a plurality of poling domains positioned along a longitudinal optical axis of the wavelength conversion device in accordance with a phase-modulated periodicity that is characterized by a phase modulation function superimposed on a carrier periodicity such that respective positions of at least some of the poling domains are longitudinally shifted relative to normal periodic positions defined by the carrier periodicity; and
    the phase-modulated periodicity of the plurality of poling domains is such that the at least three frequency-converted spectral peaks have approximately equal power when the pump beam with at least two fundamental spectral peaks is incident on the input facet of the wavelength conversion device.

11. The optical system as claimed in claim 10 wherein the phase modulation function is a rectangular wave phase modulation function such that the plurality of domains are phase-modulated by a periodic sign-reversal of selected domains.

12. The optical system as claimed in claim 11 wherein the periodic sign-reversal has a duty cycle of within a range of about 0.27 to about 0.39.

13. The optical system as claimed in claim 10 wherein the phase modulation function is a periodic trapezoidal function.

14. The optical system as claimed in claim 10 wherein the phase modulation function is a periodic rectangular function.

15. The optical system as claimed in claim 10 wherein the phase modulation function is a sinusoidal function such that the plurality of domains are continuously phase-modulated.

16. The optical system as claimed in claim 15 wherein the sinusoidal function is characterized by a total phase modulation depth ranging from about 0.88n to about 1.22n.

17. The optical system as claimed in claim 10 wherein:
the phase-modulated periodicity is such that the wavelength conversion device is characterized by three quasi-phase matching peaks comprising a first, second and third quasi-phase matching peak, the three quasi-phase matching peaks having a response ratio that produces the three frequency-converted spectral peaks having approximately equal power when the pump beam of the optical source is incident on the input facet of the wavelength conversion device; and
the first and third quasi-phase matching peak are for the frequency doubling of at least two of the fundamental spectral peaks and the second quasi-phase matching peak is for the sum-frequency generation of at least two of the fundamental spectral peaks.

18. The optical system as claimed in claim 17 wherein the quasi-phase matching peaks of the wavelength conversion device corresponding to the first and third frequency-converted spectral peaks have a magnitude that is greater than a magnitude of the quasi-phase matching peak of the wavelength conversion device corresponding to the second frequency-converted spectral peak.

19. The optical system as claimed in claim 10 wherein the length of the wavelength conversion device is within a range of about $(m+0.1)*\Lambda_S$ to about $(m+0.5)*\Lambda_S$, where $\Lambda_S$ is the period of the phase modulation function and m is a non-negative integer.

20. The optical system as claimed in claim 1 wherein the non-linear optical medium is characterized by at least three phase matching peaks for second harmonic generation and sum-frequency generation based at least in part on a modulation of the effective refractive index of the non-linear optical medium along a longitudinal optical axis of the wavelength conversion device.

21. A optical system comprising an optical source and a wavelength conversion device, wherein:
the optical source comprises at least one laser configured to emit a pump beam having at least two fundamental spectral peaks separated by at least 0.5 nanometers in wavelength;
the wavelength conversion device comprises a single quasi-periodically poled non-linear optical medium comprising a plurality of domains positioned along a longitudinal optical axis of the wavelength conversion device in accordance with a phase-modulated periodicity that is characterized by a phase modulation function superimposed on a carrier periodicity such that respective positions of at least some of the domains are longitudinally shifted relative to normal periodic positions defined by the carrier periodicity;
the phase-modulated periodicity of the plurality of poling domains is such that an output beam comprising at least three frequency-converted spectral peaks having approximately equal power and separated by at least 0.25 nanometer in wavelength is emitted from an output facet of the wavelength conversion device when the pump beam of the optical source is incident on an input facet of the wavelength conversion device; and
the number of frequency-converted spectral peaks of the output beam is greater than the number of fundamental spectral peaks of the pump beam.

\* \* \* \* \*

UNITED STATES PATENT AND TRADEMARK OFFICE
CERTIFICATE OF CORRECTION

PATENT NO. : 8,320,418 B2  
APPLICATION NO. : 12/782205  
DATED : November 27, 2012  
INVENTOR(S) : Dmitri Vladislavovich Kuksenkov et al.

It is certified that error appears in the above-identified patent and that said Letters Patent is hereby corrected as shown below:

*Col.*  *Line*      *Claim 16*  
29      15          "tion depth ranging from about 0.88n to about 1.22n."—should read "tion depth ranging from about $0.88\pi$ to about $1.22\,\pi$."

Signed and Sealed this  
First Day of October, 2013

Teresa Stanek Rea  
*Deputy Director of the United States Patent and Trademark Office*